(12) United States Patent
Lai et al.

(10) Patent No.: US 9,455,724 B2
(45) Date of Patent: Sep. 27, 2016

(54) READOUT SYSTEM

(71) Applicant: NATIONAL CHIAO TUNG UNIVERSITY, Hsinchu (TW)

(72) Inventors: Kelvin Yi-Tse Lai, Changhua County (TW); Zih-Cheng He, New Taipei (TW); Yu-Tao Yang, Kaohsiung (TW); Yu-Chi Kao, Kaohsiung (TW); Hsie-Chia Chang, Hsinchu (TW); Chen-Yi Lee, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/974,149

(22) Filed: Dec. 18, 2015

(65) Prior Publication Data
US 2016/0182062 A1 Jun. 23, 2016

(30) Foreign Application Priority Data

Dec. 19, 2014 (TW) .............................. 103144489 A

(51) Int. Cl.
*H03L 7/06* (2006.01)
*H03L 7/08* (2006.01)
*H03L 7/097* (2006.01)
*H03L 7/081* (2006.01)
*H03M 1/50* (2006.01)

(52) U.S. Cl.
CPC ............ *H03L 7/0802* (2013.01); *H03L 7/0818* (2013.01); *H03L 7/097* (2013.01); *H03M 1/50* (2013.01)

(58) Field of Classification Search
CPC ... H03L 7/0802; H03L 7/097; H03L 7/0818; H03M 1/014; H03M 1/12

USPC ........ 327/156–159, 147–150, 378, 512, 513; 375/373–376; 331/1 A, 1 R
See application file for complete search history.

(56) References Cited

U.S. PATENT DOCUMENTS

| 7,129,760 B2 * | 10/2006 | Millar .............. G01R 31/31922 327/158 |
| 2010/0141328 A1 * | 6/2010 | Meninger ............ H03L 7/0812 327/512 |
| 2011/0093753 A1 * | 4/2011 | Takagi ................ G06F 11/1004 714/746 |

(Continued)

FOREIGN PATENT DOCUMENTS

| TW | I268450 | 12/2006 |
| TW | I392877 B1 | 4/2013 |

OTHER PUBLICATIONS

Mantyniemi, A.; Rahkonen, T.; Kostamovaara, J., "A high resolution digital CMOS time-to-digital converter based on nested delay locked loops," Circuits and Systems,1999. ISCAS' 99. Proceedings of the 1999 IEEE International Symposium, vol. 2, pp. 537-540. Jul 1999.

(Continued)

*Primary Examiner* — Lincoln Donovan
*Assistant Examiner* — Thomas Skibinski
(74) *Attorney, Agent, or Firm* — McNees Wallace & Nurick LLC

(57) ABSTRACT

A readout system includes a sensing module to generate first and second voltage signals with a phase difference associated with an environmental parameter, and a readout module configured to calibrate the phase difference, and to convert the calibrated phase difference into an output code.

22 Claims, 15 Drawing Sheets

(56) References Cited

U.S. PATENT DOCUMENTS

| | | | | |
|---|---|---|---|---|
| 2011/0109359 | A1* | 5/2011 | Greenberg | H03B 5/02 327/158 |
| 2015/0268185 | A1* | 9/2015 | Lee | B01L 3/502792 204/406 |
| 2016/0182059 | A1* | 6/2016 | Ek | H03L 7/085 327/157 |

OTHER PUBLICATIONS

Chen, Poki; Chen, Chun-Chi; Chin-Chung Tsai; Wen-Fu Lu, "A time-to-digital-converter-based CMOS smart temperature sensor," IEEE Journal of Solid-State Circuits, vol. 40, issue 8, pp. 1642-1648. Aug. 2005.

Saputra, N.; Pertijs, M.A.P.; Makinwa, K.A.A.; Huijsing, J.H., "Sigma delta ADC with a dynamic reference for accurate temperature and voltage sensing," Circuits and Systems, 2008. ISCAS 2008. IEEE International Symposium, pp. 1208-1211. May 18-21, 2008.

Woo, Kyoungho; Meninger, S.; Xanthopoulos, Thucydides; Crain, E.; Dongwan Ha; Ham, D., "Dual-DLL-based CMOS all-digital temperature sensor for microprocessor thermal monitoring," Solid-State Circuits Conference—Digest of Technical Papers, 2009. ISSCC 2009. IEEE International, pp. 68, 69, 69a. Feb. 8-12, 2009.

Liao, Shu-Xian; Lin, Zhi-Ming, "A high resolution temperature detection circuit," Information, Communications and Signal Processing (ICICS) 2011 8th International Conference, pp. 1-4. Dec. 13-16, 2011.

* cited by examiner

READOUT SYSTEM

CROSS-REFERENCE TO RELATED APPLICATION

This application claims priority of Taiwanese Application No. 103144489, filed on Dec. 19, 2014.

FIELD

The disclosure relates to a readout system, and more particularly to a readout system that may be capable of calibration and/or power-saving.

BACKGROUND

Referring to FIG. 1, a conventional readout system 9 is shown to include a sensing module 91, a converting circuit 92 and an ADC (analog to digital converter) 93.

The sensing module 91 senses an environmental parameter, such as acceleration, temperature, humidity, etc., and includes a variable capacitor (not shown). The variable capacitor may have a capacitance varying with a magnitude of the environmental parameter, such as a temperature magnitude, a humidity magnitude, a variation of acceleration, etc.

The converting circuit 92 detects the capacitance of the variable capacitor of the sensing module 91 and generates an analog voltage signal having an amplitude proportional to the capacitance.

The ADC 93 receives the analog voltage signal from the converting circuit 92 and converts the analog voltage signal into an output code.

However, in mass production, the capacitance of the variable capacitor of each of the aforementioned conventional readout systems 9 may be different due to process variation, and therefore the output codes provided by different conventional readout systems 9 may be different with the same environmental parameter. In addition, since users may not have demands to keep reading the output code when in a stable environment, continuous output of the output code may result in unnecessary power consumption.

SUMMARY

Therefore, an object of the disclosure is to provide a readout system that is capable of calibration.

According to one aspect of the disclosure, the readout system is provided for generating an output code associated with an environmental parameter, and includes a sensing module and a readout module.

The sensing module is disposed to receive an input voltage signal and is configured to sense the environmental parameter, and to generate, according to the input voltage signal and the environmental parameter, a first voltage signal and a second voltage signal that have a phase difference therebetween.

The readout module includes a delay-locked loop and a readout circuit. The delay-locked loop is coupled to the sensing module for receiving the first and second voltage signals therefrom, and is configured to output a lagged one of the first and second voltage signals to serve as a third voltage signal, and to delay the other one of the first and second voltage signals by a calibration period associated with a predetermined value of the environmental parameter to output a fourth voltage signal. The readout circuit is disposed to receive the input voltage signal, is coupled to the delay-locked loop for receiving the third and fourth voltage signals therefrom, and is configured to convert a phase difference between the third and fourth voltage signals, according to the input voltage signal, into the output code when the readout module operates in a normal operation mode.

Another object of the disclosure is to provide a readout system that may be relatively power-saving.

According to another aspect of the disclosure, the readout system is provided for generating an output code associated with an environmental parameter, and includes a sensing module and a readout module.

The sensing module is disposed to receive an input voltage signal and configured to sense the environmental parameter, and to generate, according to the input voltage signal and the environmental parameter, a first voltage signal and a second voltage signal that have a phase difference therebetween.

The readout module includes a readout circuit and a monitoring circuit. The readout circuit is disposed to receive the input voltage signal and a wakeup signal, is coupled to the sensing module for receiving the first and second voltage signals therefrom, and is configured to convert or not covert the phase difference between the first and second voltage signals into the output code according to the wakeup signal. The monitoring circuit is coupled to the sensing module for receiving the first and second voltage signals therefrom, and is configured to generate the wakeup signal according to the first and second voltage signals.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
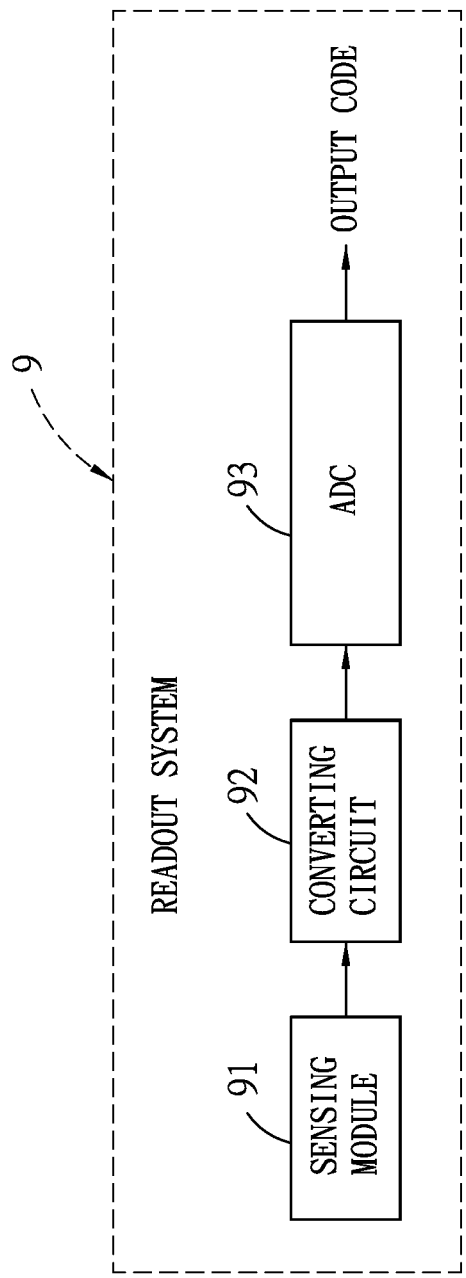
FIG. 1 is a block diagram illustrating a conventional readout system.

Before the disclosure is described in greater detail, it should be noted that like elements are denoted by the same reference numerals throughout the disclosure.

Figure 2:
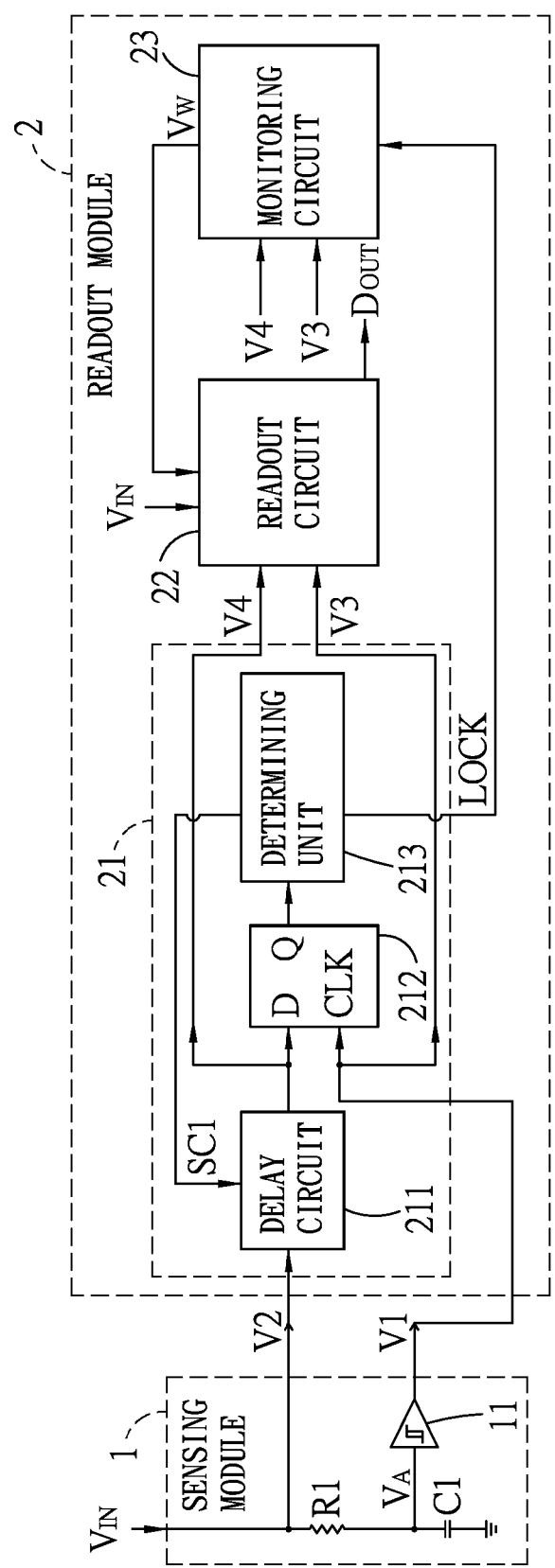
FIG. 2 is a block diagram illustrating a first embodiment of the readout system according to this disclosure.

Referring to FIG. 2, the first embodiment of the readout system according to this disclosure is configured to generate an output code ($D_{OUT}$) associated with an environmental parameter (e.g., acceleration, temperature, humidity, etc.), and includes a sensing module 1 and a readout module 2. The readout module 2 includes a first DLL (delay-locked loop) 21, a readout circuit 22 and a monitoring circuit 23. The output code ($D_{OUT}$) may reflect a magnitude or a variation of the environmental parameter. In this embodiment, the environmental parameter is ambient humidity of an environment in which the sensing module 1 is located, and the output code ($D_{OUT}$) reflects a magnitude of the ambient humidity.

The sensing module 1 senses the environmental parameter, receives an input voltage signal ($V_{IN}$) that has a rectangular waveform, and generates, according to the input voltage signal ($V_{IN}$) and the environmental parameter, a first voltage signal (V1) and a second voltage signal (V2) that have a first phase difference between positive edges thereof. In this embodiment, the sensing module 1 outputs the input voltage signal ($V_{IN}$) to serve as the second voltage signal (V2), and includes a resistor (R1), a capacitor (C1) and a comparator 11. The resistor (R1) has a first terminal receiving the input voltage signal ($V_{IN}$), and a second terminal. The capacitor (C1) is coupled between the second terminal of the resistor (R1) and a reference node, e.g., ground, and has a capacitance associated with a current environmental parameter. As an example, the capacitance may become greater with higher humidity. The comparator 11 has an input terminal coupled to the second terminal of the resistor (R1), and outputs the first voltage signal (V1). The comparator 11 receives a voltage ($V_A$) across the capacitor (C1), and the first voltage signal (V1) is logic "1" when the voltage ($V_A$) is greater than a predetermined threshold voltage, and is logic "0" when otherwise. In this embodiment, the comparator 11 is a Schmitt trigger, and the predetermined threshold voltage is between 0V and a power-source voltage. In other embodiments, the comparator 11 may be implemented using other types of comparator circuits.

When the input voltage signal ($V_{IN}$) transitions from logic "0" to logic "1" (i.e., the positive edge), the voltage ($V_A$) across the capacitor (C1) gradually increases from logic "0" (e.g., 0V) to logic "1" (e.g., the power-source voltage), so that the positive edge of the second voltage signal (V2) leads the positive edge of the first voltage signal (V1). Since a time constant that represents a duration of charging the capacitor (C1) is associated with a product of a resistance value of the resistor (R1) and a capacitance value of the capacitor (C1), and since the capacitance value of the capacitor (C1) is associated with the humidity, the first phase difference is associated with the environmental parameter (i.e., the humidity).

The first DLL 21 of the readout module 2 is coupled to the sensing module 1 for receiving the first and second voltage signals (V1, V2) therefrom, outputs the first voltage signal (V1) that lags the second voltage signal (V2) to serve as a third voltage signal (V3), delays the second voltage signal (V2) by a calibration period associated with a predetermined value of the environmental parameter to output a fourth voltage signal (V4), and outputs a calibration indication signal (LOCK). The first DLL 21 includes a delay circuit 211, a phase detector 212 and a determining unit 213.

The delay circuit 211 is coupled to the first terminal of the first resistor (R1) of the sensing module 1 for receiving the second voltage signal (V2) therefrom, and generates the fourth voltage signal (V4) according to a control signal (SC1) that indicates the calibration period.

Figure 3:
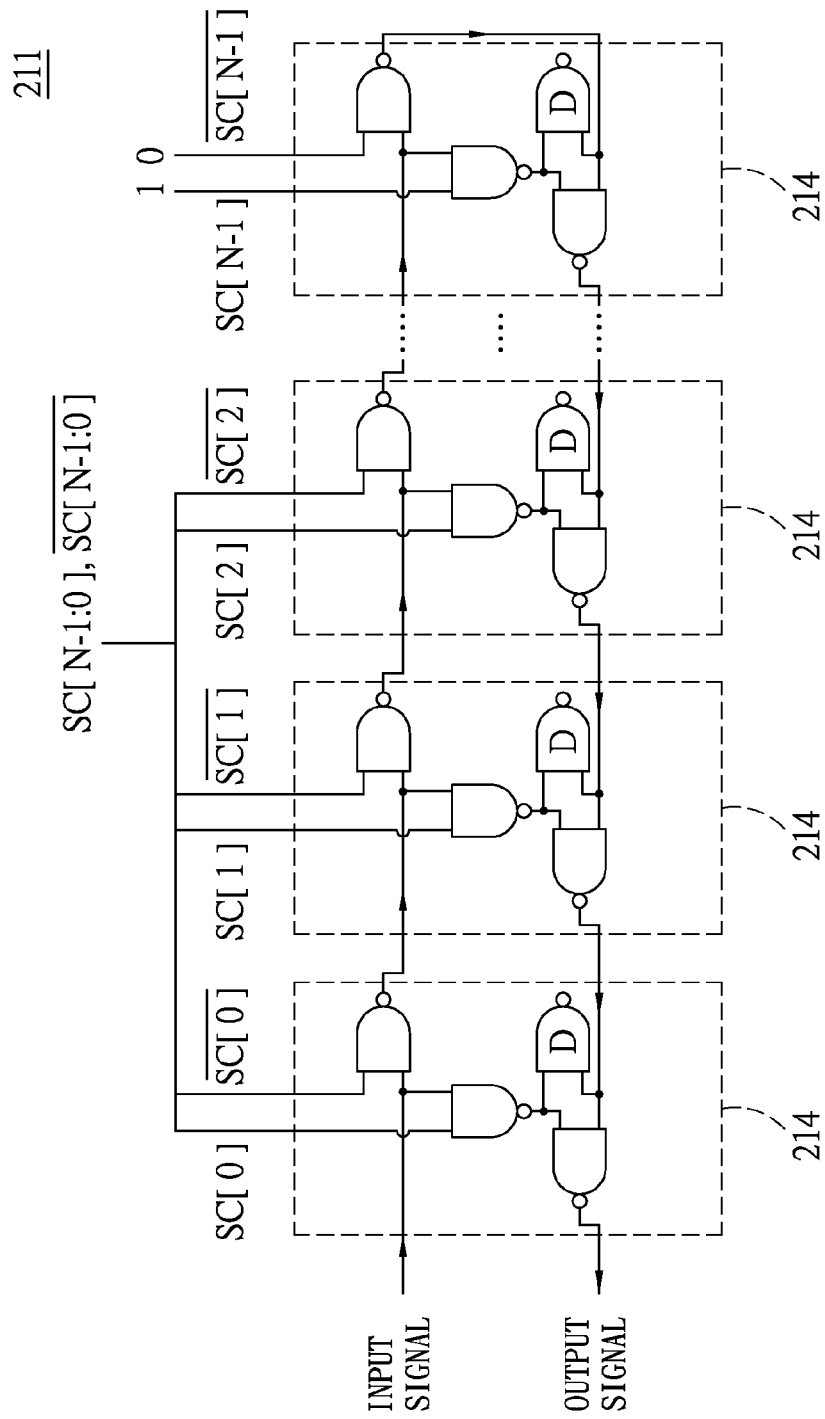
FIG. 3 is a schematic circuit diagram illustrating a delay circuit of the first embodiment.

Referring to FIG. 3, the delay circuit 211 includes first to $N^{th}$ delay cells 214 that are coupled together one by one. In this embodiment, the control signal (SC1) has 2N bits of SC1[N-1:0] and $\overline{SC1[N-1:0]}$ that have complementary logic values, where SC[N-1] is always logic 1 and $\overline{SC1[N-1]}$ is always logic 0. The first delay cell 214 is configured, based upon the logic values of the bits SC1[0] and $\overline{SC1[0]}$, to invert an input signal thereof which serves as an input signal of the delay circuit 211 (e.g., the second voltage signal (V2)) and output the inverted input signal to the second delay cell 214, or to delay the input signal thereof and output the delayed input signal to serve as an output signal thereof. Similarly, the $K^{th}$ (K=2, 3, ..., N-1) delay cell 214 is configured, based upon the logic values of the bits SC1[K-1] and $\overline{SC1[K-1]}$, to invert an input signal thereof (i.e., the inverted input signal of the $(K-1)^{th}$ delay cell 214), and output the inverted input signal to the $(K+1)^{th}$ delay cell 214, or to delay the input signal, and output the delayed input signal to the $(K-1)^{th}$ delay cell 214. The $N^{th}$ delay cell 214 is configured to delay an input signal thereof, and output the delayed input signal to the $(N-1)^{th}$ delay cell 214. In this embodiment, the output signal of the first delay cell 214 is the output signal of the delay circuit 211, i.e., the fourth voltage signal (V4).

Hereinafter, it is exemplified that N=4 to facilitate describing the operation of the delay circuit 211. According to the logic circuit illustrated in FIG. 3, when the control signal SC1[3:0]=1000, the input signal of the delay circuit 211 is outputted after being delayed by the first to fourth delay cells 214. When the control signal SC1[3:0]=1100, the input signal of the delay circuit 211 is outputted after being delayed by the first to third delay cells 214. When the control signal SC1[3:0]=1110, the input signal of the delay circuit 211 is outputted after being delayed by the first and second delay cells 214. When the control signal SC1[3:0]=1111, the input signal of the delay circuit 211 is outputted after being delayed by only the first delay cell 214. It is noted that each of the delay cells 214 is configured to delay the input signal thereof by the same unit period. Accordingly, via the control signal (SC1) that determines a number of the delay cells 214 which the second voltage signal (V2) passes, the delay circuit 211 may delay the second voltage signal (V2) by the required period, i.e., the calibration period, to obtain the fourth voltage signal (V4).

In this embodiment, each of the delay cells 214 is composed of four NAND gates, one of which is a dummy NAND gate (D) for load balance. In other embodiments, the delay cells 214 may be implemented using other conventional logic components.

Referring back to FIG. 2, the phase detector 212 is coupled to the comparator 11 for receiving the first voltage signal (V1), which serves as the third voltage signal (V3), and to the delay circuit 211 for receiving the fourth voltage signal (V4) therefrom, and detects phases of the third and fourth voltage signals (V3, V4) so as to generate a first phase detection signal.

In this embodiment, the phase detector 212 is a D flip-flop, and has a clock terminal (CLK) receiving the first voltage signal (V1), a data terminal (D) receiving the fourth voltage signal (V4), and an output terminal (Q) outputting the first phase detection signal that is logic "1" when the positive edge of the fourth voltage signal (V4) leads the positive edge of the first voltage signal (V1) (equivalent to the third voltage signal (V3)), and that is logic "0" when the positive edge of the fourth voltage signal (V4) lags the positive edge of the third voltage signal (V3).

The determining unit 213 is coupled to the phase detector 212 for receiving the first phase detection signal therefrom, and generates, according to the first phase detection signal, a calibration indication signal (LOCK) and the control signal (SC1) that is provided to the delay circuit 211. Detailed operation of the determining unit 213 will be described hereinafter.

The readout circuit 22 is coupled to the first DLL 21 for receiving the third and fourth voltage signals (V3, V4) therefrom, receives the input voltage signal ($V_{IN}$) and a wakeup signal ($V_W$), determines to convert or not convert a second phase difference between the third and fourth voltage signals (V3, V4) into the output code ($D_{OUT}$) according to the input voltage signal ($V_{IN}$) and the wakeup signal ($V_W$), and converts the second phase difference into the output code ($D_{OUT}$) according to the input voltage signal ($V_{IN}$) and the wakeup signal ($V_W$) when determined to do so.

Figure 4:
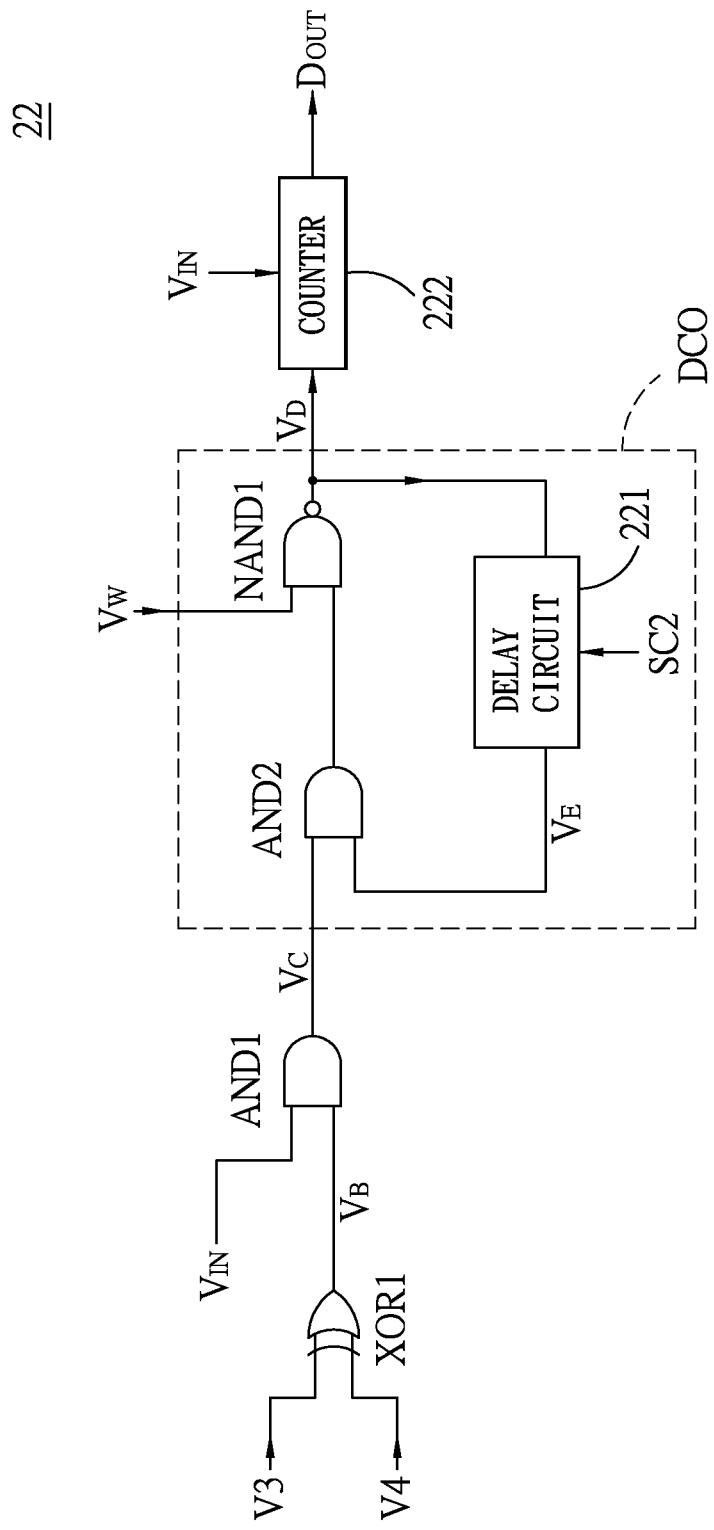
FIG. 4 is a schematic circuit diagram illustrating a readout circuit of the first embodiment.

Referring to FIG. 4, the readout circuit 22 includes an XOR gate (XOR1), an AND gate (AND1), a DCO (digital controlled oscillator) and a counter 222.

The XOR gate (XOR1) has a first input terminal and a second input terminal coupled to the first DLL 21 for respectively receiving the third and fourth voltage signals (V3, V4) therefrom, and an output terminal.

The AND gate (AND1) has a first input terminal receiving the input voltage signal ($V_{IN}$), a second input terminal coupled to the output terminal of the XOR gate (XOR1), and an output terminal.

The DCO is coupled to the output terminal of the AND gate (AND1), receives the wakeup signal ($V_W$), and generates or does not generate an oscillating signal ($V_D$) according to the wakeup signal ($V_W$) and a signal ($V_C$) at the output terminal of the AND gate (AND1). In this embodiment, the DCO outputs the oscillating signal ($V_D$) only when both of the wakeup signal ($V_W$) and the signal ($V_C$) are logic "1's", and outputs logic "0" or logic "1" constantly when otherwise. The DCO includes an AND gate (AND2), a NAND gate (NAND1) and a delay circuit 221. The AND gate (AND2) has a first input terminal coupled to the output terminal of the AND gate (AND1), a second input terminal, and an output terminal. The NAND gate (NAND1) has a first input terminal receiving the wakeup signal ($V_W$), a second input terminal coupled to the output terminal of the AND gate (AND2), and an output terminal. The delay circuit 221 receives and delays a signal (e.g., the oscillating signal ($V_D$)) at the output terminal of the NAND gate (NAND1) by an oscillator period for subsequent provision of a signal ($V_E$) thus delayed to the second input terminal of the AND gate (AND2). The delay circuit 221 may be implemented using the circuit structure shown in FIG. 3, but a number of the delay cells 214 thereof may be different from that of the delay circuit 211. In this embodiment, the delay circuit 221 of the DCO receives a control signal (SC2) that indicates the oscillator period to determine an oscillating frequency of the oscillating signal ($V_D$), and that may be provided by other external circuits or be given a fixed value.

The counter 222 receives the input voltage signal ($V_{IN}$), is coupled to the DCO for receiving the oscillating signal ($V_D$) therefrom, and generates the output code ($D_{OUT}$) according to the input voltage signal ($V_{IN}$) and the oscillating signal ($V_D$).

The counter 222 resets the output code ($D_{OUT}$) to zero when the input voltage signal ($V_{IN}$) is logic "0", and adds one to the output code ($D_{OUT}$) when the oscillating signal ($V_D$) transitions from logic "0" to logic "1" (i.e., upon a positive edge of the oscillating signal ($V_D$)) and when the input voltage signal ($V_{IN}$) is logic "1", so as to count a number of positive edges of the oscillating signal ($V_D$) during one positive cycle of the input voltage signal ($V_{IN}$). Since the frequency of the oscillating signal ($V_D$) is a controllable known parameter and since the oscillating signal ($V_D$) is only provided when both of the signal ($V_C$) and the wakeup signal ($V_W$) are logic "1's", the second phase difference between the third and fourth voltage signals (V3, V4) may be acquired via the output code ($D_{OUT}$), to thereby derive the magnitude of the humidity.

Referring to FIG. 2, the monitoring circuit 23 is coupled to the first DLL 21 for receiving therefrom the calibration indication signal (LOCK), the third voltage signal (V3) and the fourth voltage signal (V4), and generates the wakeup signal ($V_W$), which is provided to the readout circuit 22, according to the calibration indication signal (LOCK), the third voltage signal (V3) and the fourth voltage signal (V4). In this embodiment, the monitoring circuit 23 includes a second DLL 231 and a detecting unit 236, as shown in FIG. 5.

The second DLL 231 is coupled to the first DLL 21 for receiving the third and fourth voltage signals (V3, v4) therefrom, outputs the third voltage signal (V3) to serve as a fifth voltage signal (V5), and delays the fourth voltage signal (V4) by a monitoring period associated with the second phase difference between the third and fourth voltage signals (V3, v4) to output a sixth voltage signal (V6). In this embodiment, the second DLL 231 includes a delay circuit 232, a phase detector 233 and a determining unit 234. The delay circuit 232 receives a control signal (SC3) that indicates the monitoring period, is coupled to the first DLL 21 for receiving the fourth voltage signal (V4) therefrom, and generates the sixth voltage signal (V6) according to the fourth voltage signal (V4) and the control signal (SC3). The delay circuit 232 may be implemented using the circuit structure shown in FIG. 3, but a number of the delay cells 214 thereof may be different from that of the delay circuit 211.

Figure 5:
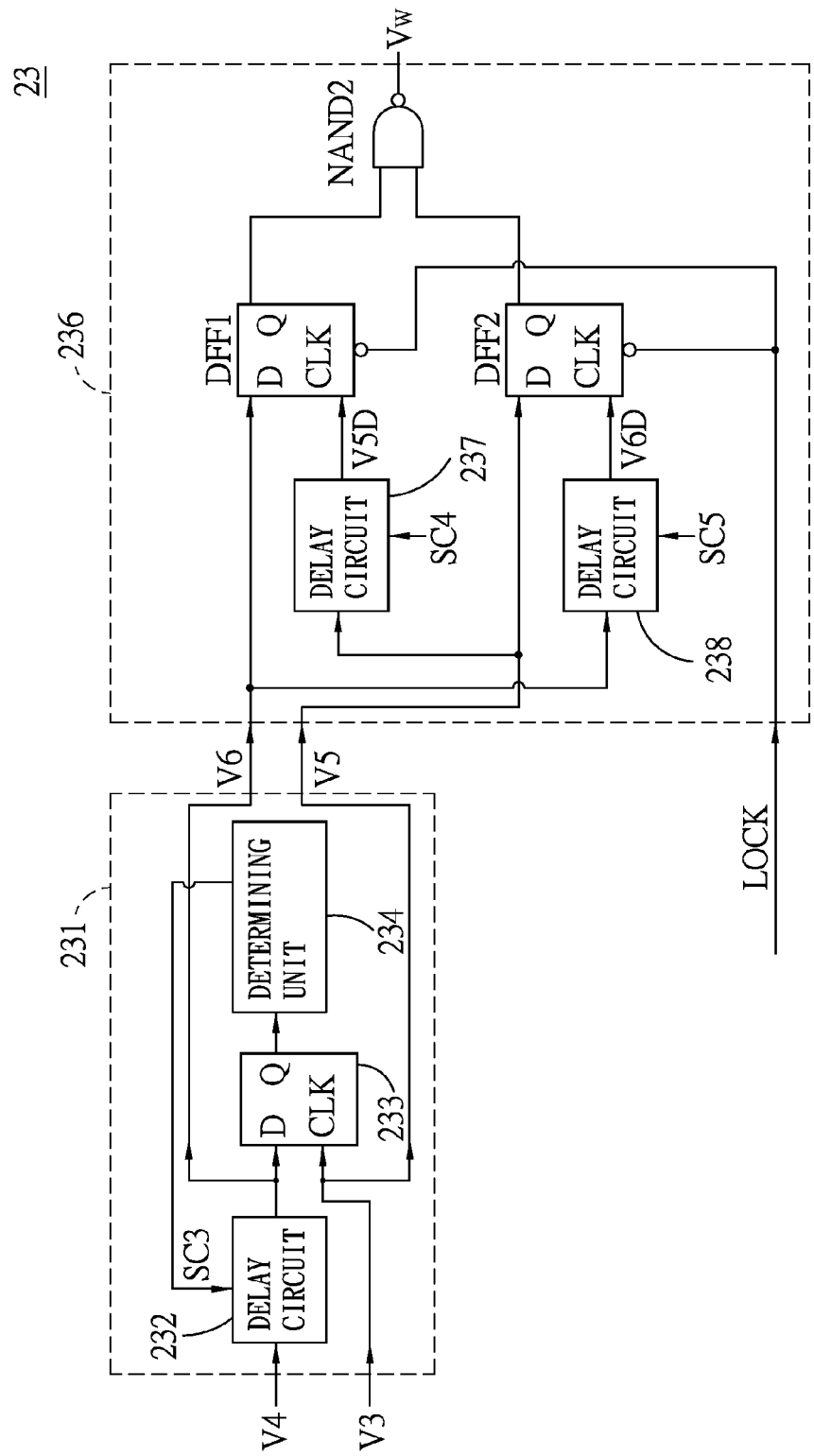
FIG. 5 is a schematic circuit diagram illustrating a monitoring circuit of the first embodiment.

Referring to FIGS. 2 and 5, the phase detector 233 is coupled to the first DLL 21 for receiving the third voltage signal (V3) therefrom, which serves as the fifth voltage signal (V5), to the delay circuit 232 for receiving the sixth voltage signal (V6) therefrom, and generates a second phase detection signal according to phases of the third and sixth voltage signals (V3, V6), equivalent to the phases of the fifth and sixth voltage signals (V5, V6). In this embodiment, the phase detector 233 is a D flip-flop that has the same structure as that of the phase detector 212, and has a clock terminal (CLK) receiving the third voltage signal (V3), a data terminal (D) receiving the sixth voltage signal (V6), and an output terminal (Q) outputting the second phase detection signal.

The determining unit 234 is coupled to the phase detector 233 for receiving the second phase detection signal therefrom, and generates according to the second phase detection signal the control signal (SC3) that is provided to the delay circuit 232 and that indicates the monitoring period.

Referring to FIG. 5, the detecting unit 236 includes a first delay circuit 237, a second delay circuit 238, a first flip-flop (DFF1), a second flip-flop (DFF2) and a NAND gate (NAND2).

The first delay circuit 237 is coupled to the second DLL 231 for receiving the fifth voltage signal (V5) therefrom, and delays the fifth voltage signal (V5) by a predetermined first delay period to output a delayed fifth voltage signal (V5D).

The second delay circuit 238 is coupled to the second DLL 231 for receiving the sixth voltage signal (V6) therefrom, and delays the sixth voltage signal (V6) by a predetermined second delay period to output a delayed sixth voltage signal (V6D). It is noted that each of the first and second delay circuits 237, 238 may be implemented using the circuit structure shown in FIG. 3, but a number of the delay cells 214 thereof may be different from that of the delay circuit 211. In this embodiment, the first and second delay circuits 237, 238 respectively receive control signals (SC4, SC5) that respectively indicate the first predetermined delay period and the second predetermined delay period, and that may be provided by other external circuits or be given respective fixed values.

The first flip-flop (DFF1) has a reset terminal coupled to the first DLL 21 for receiving the calibration indication signal (LOCK) therefrom, a clock terminal (CLK) coupled to the first delay circuit 237 for receiving the delayed fifth voltage signal (V5D) therefrom, a data terminal (D) coupled to the second DLL 231 for receiving the sixth voltage signal (V6) therefrom, and an output terminal (Q).

The second flip-flop (DFF2) has a reset terminal coupled to the first DLL 21 for receiving the calibration indication signal (LOCK) therefrom, a clock terminal (CLK) coupled to the second delay circuit 238 for receiving the delayed sixth voltage signal (V6D) therefrom, a data terminal (D) coupled to the second DLL 231 for receiving the fifth voltage signal (V5) therefrom, and an output terminal (Q). In this embodiment, each of the first and second flip-flops (DFF1, DFF2) is a D flip-flop.

The NAND gate (NAND2) has a first input terminal and a second input terminal respectively coupled to the output terminals of the first and second flip-flops (DFF1, DFF2), and an output terminal to output the wakeup signal ($V_W$).

Referring to FIG. 2, the readout module 2 may operate in a calibration mode, a normal operation mode or a power-saving mode.

Users may place the sensing module 1 in an environment which has a predetermined environmental parameter (e.g., a relative humidity of 0%), and cause the readout module 2 to operate in the calibration mode by, for example, manually setting the calibration indication signal (LOCK) to a first logic value (e.g., logic "0"). In the calibration mode, the first DLL 21 adjusts the calibration period to substantially equal the first phase difference between the positive edges of the first and second voltage signals (V1, V2), so as to cause the third and fourth voltage signals (V3, V4) to be in-phase, and the output code ($D_{OUT}$) to be zero.

Figure 6:
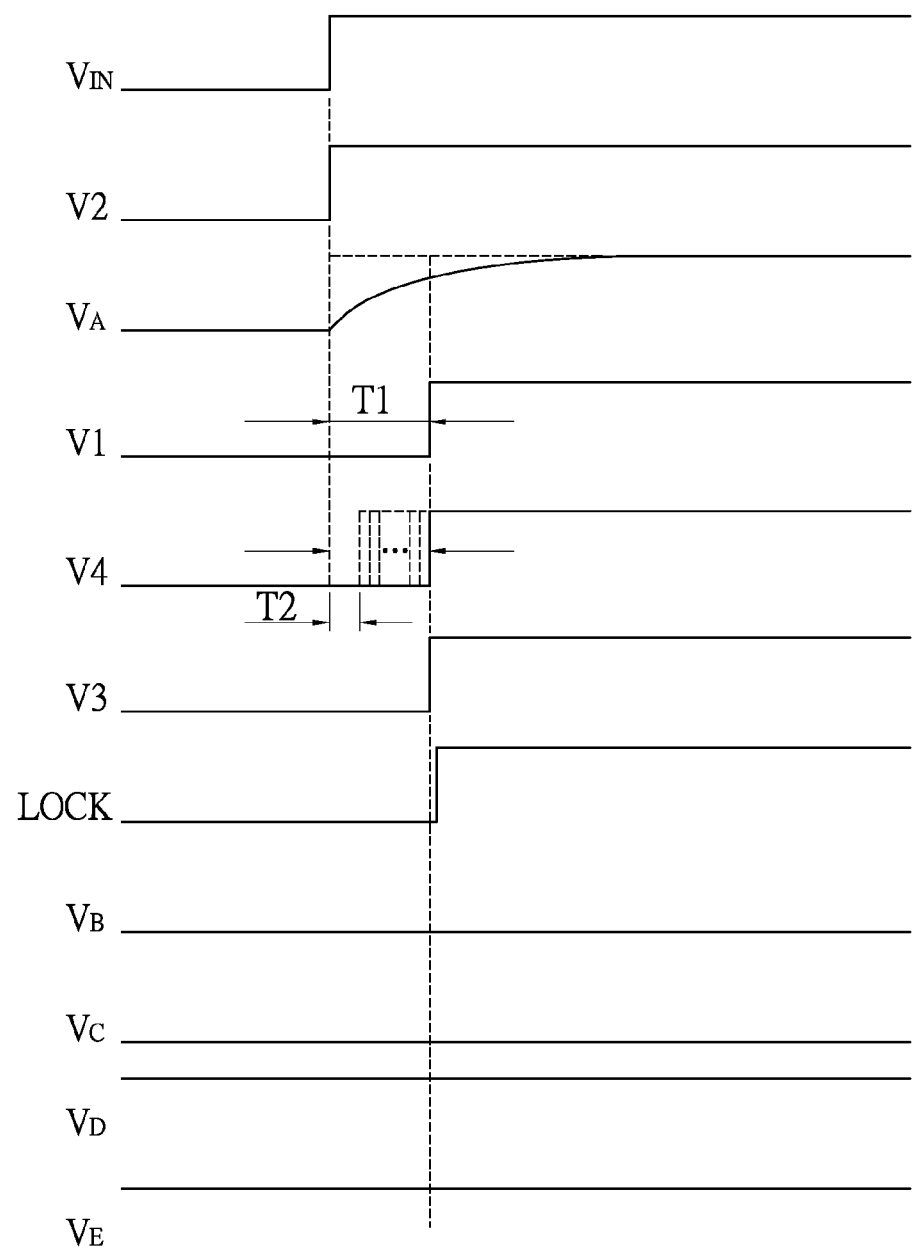
FIG. 6 is a timing diagram illustrating relationships among signals of the first embodiment when a readout module thereof operates in a calibration mode.

FIG. 6 illustrates exemplary relationships among signals in the calibration mode, and only one positive edge of the square-wave input voltage signal ($V_{IN}$) is plotted therein for simplifying description. In this example, the sensing module 1 is placed in an environment with a relative humidity of 0%, and the capacitance of the capacitor (C1) is a first reference value. In this example, it is assumed that the first phase difference by which the positive edge of the first voltage signal (V1) lags the positive edge of the second voltage signal (V2) is T1, and a time delay (i.e., the calibration period) caused by the delay circuit 211 is T2, so that the positive edge of the third voltage signal (V3) lags the positive edge of the fourth voltage signal (V4) by T1-T2. When the positive edge of the fourth voltage signal (V4) leads the positive edge of the third voltage signal (V3), the first phase detection signal outputted by the phase detector 212 is logic "1", and the determining unit 213 adjusts, according to the first phase detection signal being logic "1", the control signal (SC1) for controlling the delay circuit 211 to induce a longer T2, thereby reducing the phase difference between the positive edges of the third and fourth voltage signals (V3, V4). In contrast, when the positive edge of the fourth voltage signal (V4) lags the positive edge of the third voltage signal (V3), the first phase detection signal outputted by the phase detector 212 is logic "0", and the determining unit 213 adjusts, according to the first phase detection signal being logic "0", the control signal (SC1) for controlling the delay circuit 211 to induce a shorter T2, thereby reducing the phase difference between the positive edges of the third and fourth voltage signals (V3, V4).

In other words, the determining unit 213 adjusts the calibration period according to the first phase detection signal until the phase difference between the positive edges of the third and fourth voltage signals (V3, V4) substantially equals zero, i.e., until the third and fourth voltage signals (V3, V4) are in-phase, when the readout module 2 operates in the calibration mode. Referring to FIG. 6, the positive edge of the fourth voltage signal (V4) is gradually delayed from the dotted-line position to the solid-line position that is aligned with the positive edge of the third voltage signal (V3). Referring to FIG. 4, when the third and fourth voltage signals (V3, V4) are in-phase, the calibration period (T2) equals the first phase difference (T1) between the positive edges of the first and second voltage signals (V1, V2), the DCO of the readout circuit 22 outputs logic "1", and the output code ($D_{OUT}$) reads zero.

It is noted that "in-phase" herein may not refer to ideally perfect phase alignment or zero phase difference. In practice, since phase alignment may be limited to a resolution of the delay circuit 211, i.e., a time delay that may be induced by each delay cell 214, "in-phase" herein may refer to a phase difference smaller than the resolution of the delay circuit 211.

Accordingly, when the third and fourth voltage signals (V3, V4) are in-phase, the first phase detection signal outputted by the phase detector 212 of the first DLL 21 may continuously periodically change by turns between logic "0" and logic "1". The determining unit 213 may change the logic value of the calibration indication signal (LOCK) (e.g., from logic "0" to logic "1") upon determining that a number of changes for the logic value of the first phase detection signal reaches a predetermined number (for example, a sequence of 01010101 involves seven changes), thereby locking the control signal (SC1) that indicates the first phase difference to serve as the calibration period, and causing the readout module 2 to operate in the normal operation mode.

Figure 15:
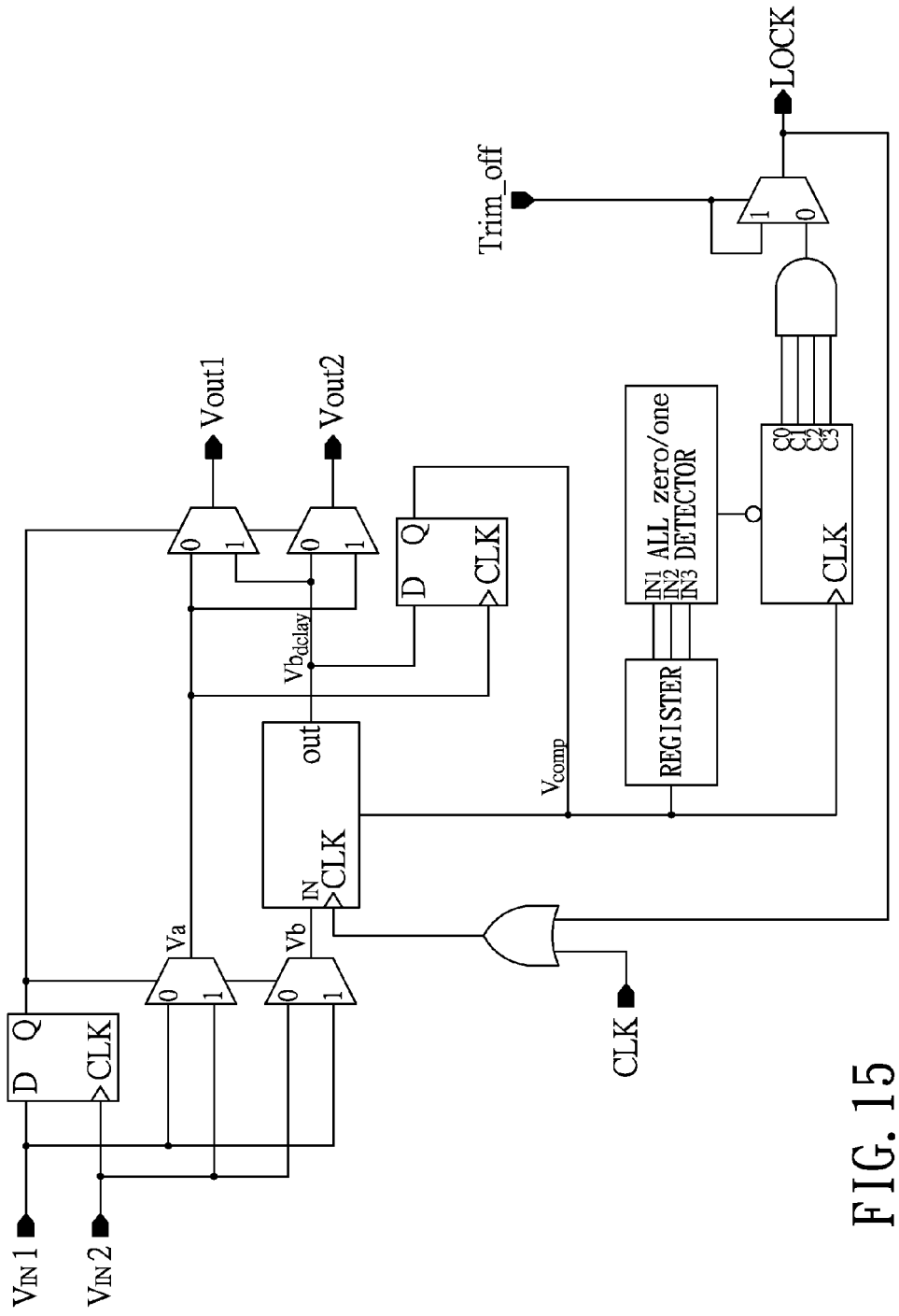
FIG. 15 is a schematic circuit diagram depicting an exemplary implementation of a determining unit.

An exemplary implementation of the determining unit 213 is illustrated in FIG. 15.

In the normal operation mode, the calibration indication signal (LOCK) has a second logic value (e.g., logic "1") that is different from the first logic value, the monitoring circuit 23 determines that a variation of the environmental parameter does not fall within a predetermined variation range according to the third and fourth voltage signals (V3, V4), and generates the wakeup signal ($V_W$) having a third logic value (e.g., logic "1"), and the readout circuit 22 outputs the output code ($D_{OUT}$) that is associated with the current environmental parameter.

Figure 7:
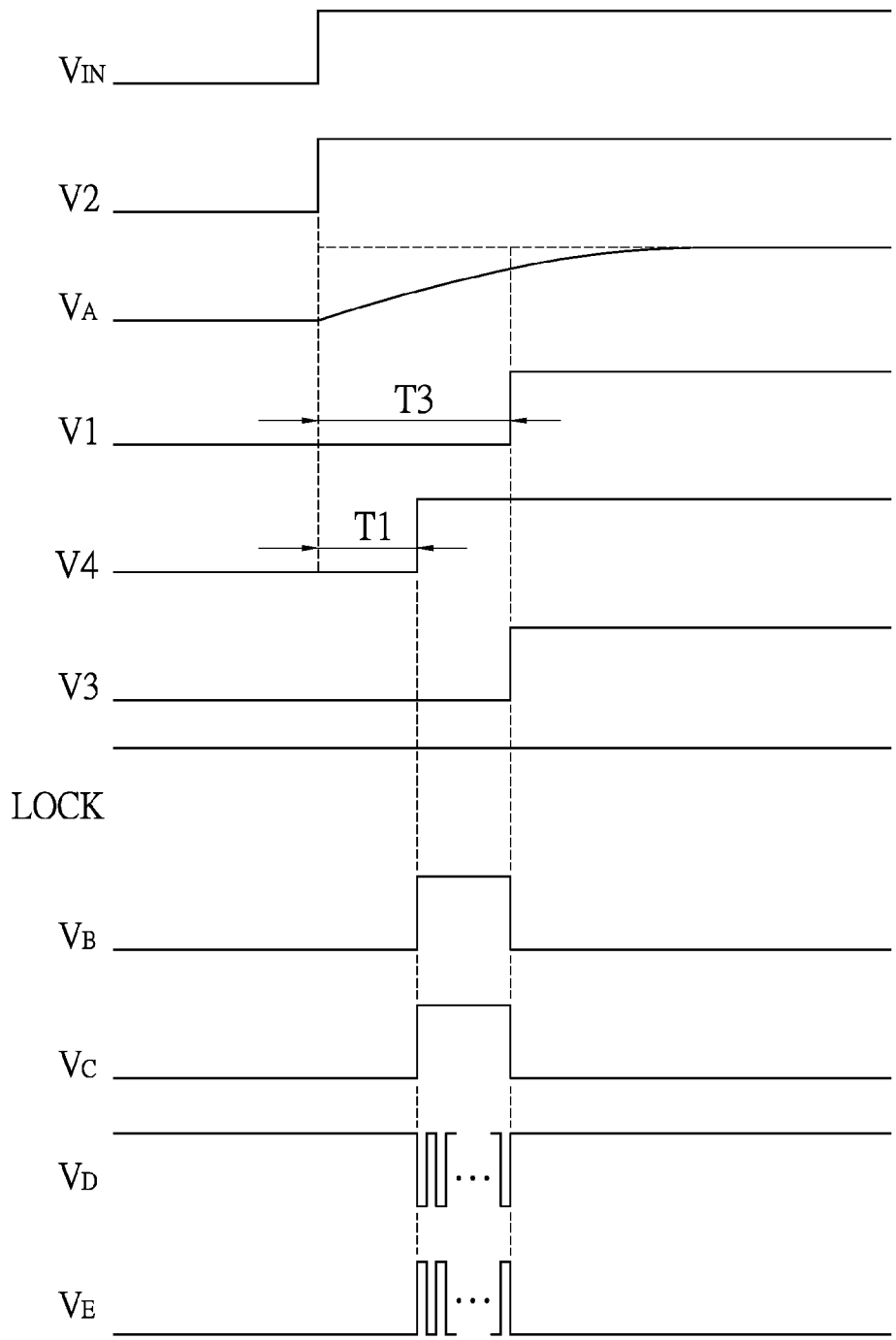
FIG. 7 is a timing diagram illustrating relationships among the signals of the first embodiment when the readout module thereof operates in a normal operation mode.

FIG. 7 illustrates exemplary relationships among signals in the normal operation mode. In this example, the sensing module 1 is placed in an environment with a to-be-measured environmental parameter, for example, with a relative humidity higher than 0%. In such an environment, the capacitance of the capacitor (C1) is greater than the first reference value. The first phase difference by which the positive edge of the first voltage signal (V1) lags the positive edge of the second voltage signal (V2) is T3, while the time delay caused by the delay circuit 211 on the second voltage signal (V2) is the calibration period (T2) that substantially equals the first phase difference (T1) in the calibration mode (see FIG. 6). Accordingly, the second phase difference by which the positive edge of the third voltage signal (V3) lags the positive edge of the fourth voltage signal (V4) is T3-T1.

Referring to FIG. 4, when each of the input voltage signal ($V_{IN}$), the wakeup signal ($V_W$) and the signal ($V_B$) at the output terminal of the XOR gate (XOR1) is logic "1", the DCO outputs the oscillating signal ($V_D$) with a known oscillating frequency. Accordingly, the second phase difference between the positive edges of the third and fourth voltage signals (V3, V4) may be acquired from the output code ($D_{OUT}$), and the humidity may be known based on a correspondence between the second phase difference and the humidity.

Therefore, even if the capacitors (C1) of the sensing modules 1 of different readout systems may be different due to process variation, the difference thereamong may be calibrated via operating the readout modules 2 of the readout systems in the calibration mode with the same environmental parameter and obtaining the same output code ($D_{OUT}$). Then, the current environmental parameter may be sensed/measured by operating the readout system in the normal operation mode.

Referring to FIG. 4, in the power-saving mode, the monitoring circuit 23 generates the wakeup signal ($V_W$) having a fourth logic value (e.g., logic "0") that is different from the third logic value, and the readout module 2 does not convert the second phase difference into the output code ($D_{OUT}$), thereby reducing power consumption.

Referring to FIGS. 2 and 5, when the readout module 2 operates in the normal operation mode or the power-saving mode, the monitoring circuit 23 determines whether or not a variation of the environmental parameter falls within the predetermined variation range according to the third and fourth voltage signals (V3, V4). The monitoring circuit 23 generates the wakeup signal ($V_W$) at the fourth logic value that causes the readout module 2 to operate in the power-saving mode when determining that the variation of the environmental parameter falls within the predetermined variation range, and generates the wakeup signal ($V_W$) at the third logic value that causes the readout module 2 to operate in the normal operation mode when otherwise.

Figure 8:
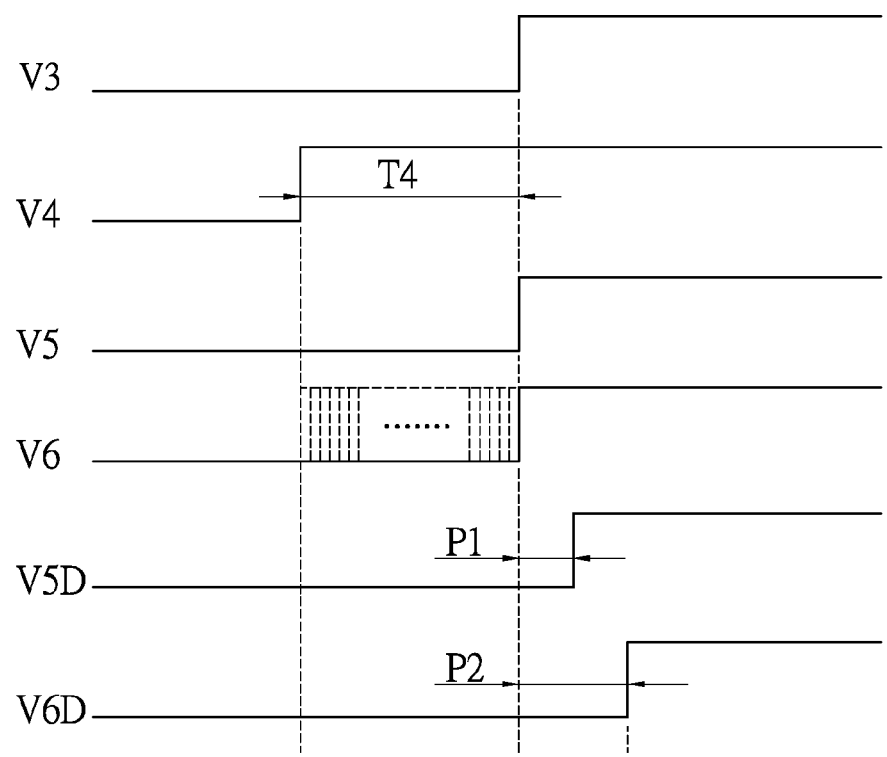
FIG. 8 is a timing diagram illustrating relationships among the signals of the monitoring circuit when the first embodiment operates in a stable environment.

FIG. 8 is a timing diagram to exemplarily illustrate operation of the monitoring circuit 23, where the predetermined first and second delay periods applied by the delay circuits 237, 238 are respectively assumed to be P1 and P2. Referring to FIGS. 2, 5 and 8, the sensing module 1 is assumed to be placed in a stable environment in which the to-be-measured environmental parameter is stable (e.g., the relative humidity maintains at 50%), and it is assumed that the second phase difference by which the positive edge of the third voltage signal (V3) lags the positive edge of the fourth voltage signal (V4) is T4. The determining unit 234 of the second DLL 231 of the monitoring circuit 23 adjusts the control signal (SC3) according to the second phase detection signal outputted by the phase detector 233, so as to control the time delay (i.e., the monitoring period) applied to the fourth voltage signal (V4) to generate the sixth voltage signal (V6) until the fifth and sixth voltage signals (V5, V6) are in-phase. At this time, the time delay applied to the fourth voltage signal equals T4.

When the fifth and sixth voltage signals (V5, V6) are in-phase, i.e., the time delay applied to the fourth voltage signal (V4) by the delay circuit 232 is T4, the wakeup signal ($V_W$) transitions from logic "1" to logic "0", the DCO of the readout circuit 22 stops output of the oscillating signal ($V_D$) to thereby reduce power consumption, and the readout module 2 starts to operate in the power-saving mode. It is noted that the algorithm of adjusting the fifth and sixth voltage signals (V5, V6) to be in-phase by the determining unit 234 may be the same as that of adjusting the third and fourth voltage signals (V3, V4) to be in-phase by the determining unit 213.

Figure 9:
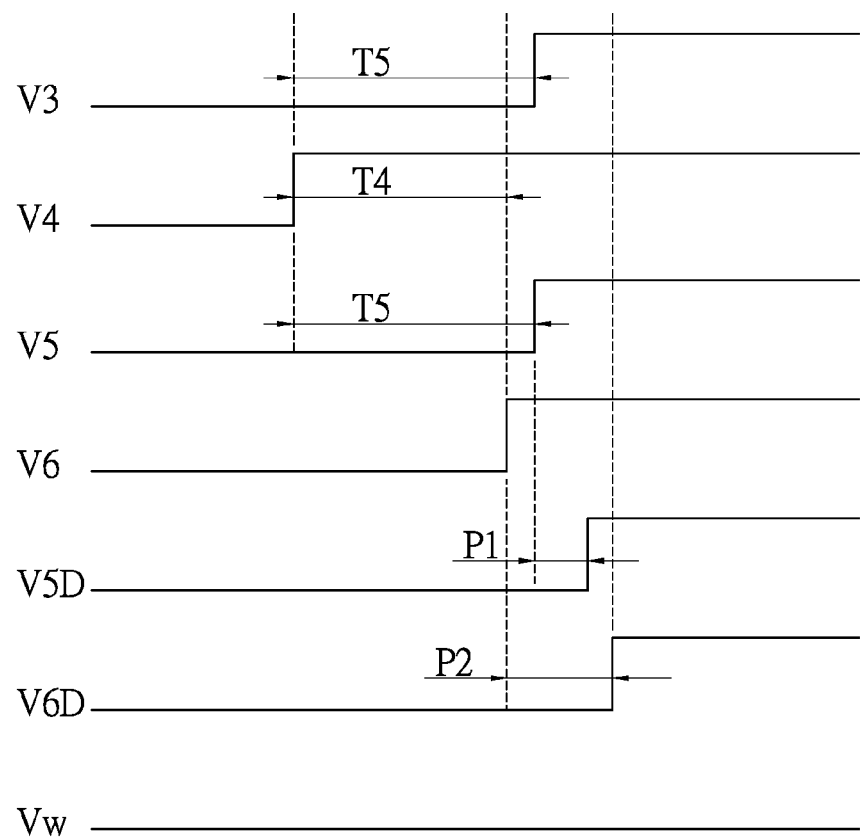
FIGS. 9-11 are timing diagrams illustrating relationships among the signals of the monitoring circuit with different variations of the environmental parameter.

Referring to FIGS. 2, 5 and 9, under the power-saving mode, when the environmental parameter has a small variation with respect to the stable environment, for example, the relative humidity changes from 50% to 52%, the capacitance of the capacitor (C1) increases, and the second phase difference by which the positive edge of the third voltage signal (V3) lags the positive edge of the fourth voltage signal (V4) is T5. If (T5-T4)<P2, i.e., the variation of the second phase difference resulting from the increment (2%) of the humidity is smaller than the predetermined second delay period, the wakeup signal ($V_W$) is still logic "0" based on the waveforms of the fifth voltage signal (V5), the sixth voltage signal (V6), the delayed fifth voltage signal (V5D) and the delayed sixth voltage signal (V6D), so that the readout module 2 remains operating in the power-saving mode.

Figure 10:
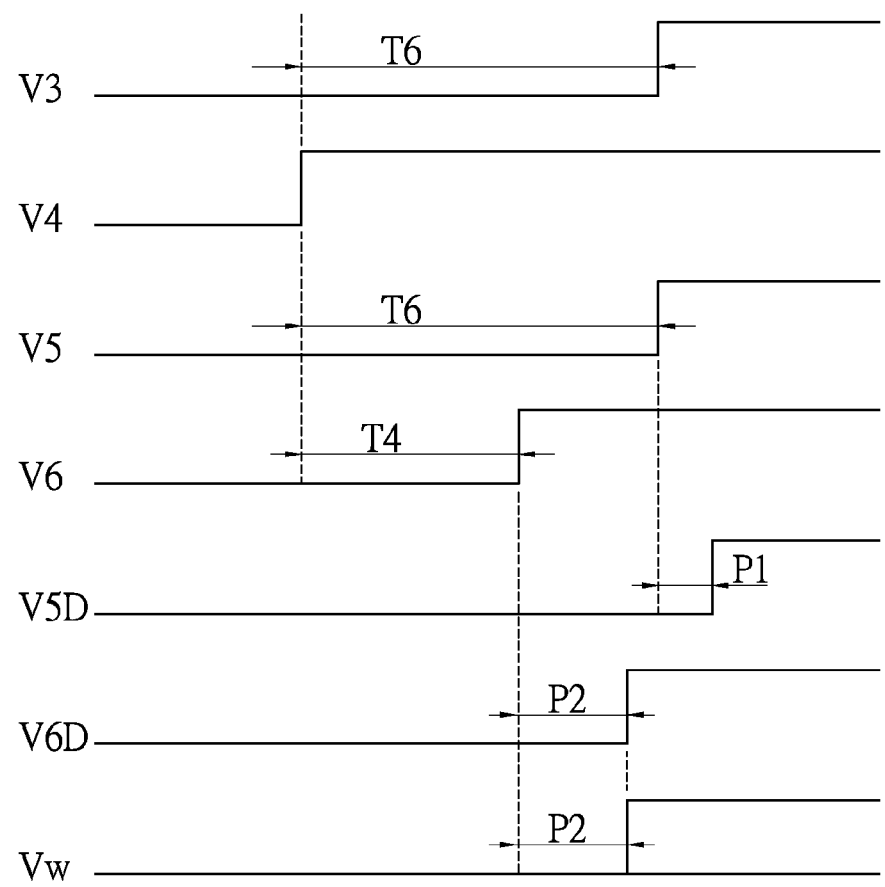

Referring to FIGS. 2, 5 and 10, under the power-saving mode, when the environmental parameter has a greater increment with respect to the stable environment, for example, the relative humidity changes from 50% to 60%, the capacitance of the capacitor (C1) increases, and the second phase difference by which the positive edge of the third voltage signal (V3) lags the positive edge of the fourth voltage signal (V4) is T6. If (T6-T4)>P2, i.e., the variation of the second phase difference resulting from the increment (10%) of the humidity is greater than the predetermined second delay period, the wakeup signal ($V_W$) transitions from logic "0" to logic "1" at the positive edge of the sixth voltage signal (V6) based on the waveforms of the fifth voltage signal (V5), the sixth voltage signal (V6), the delayed fifth voltage signal (V5D) and the delayed sixth voltage signal (V6D), so that the readout module 2 starts to operate in the normal operation mode.

Figure 11:
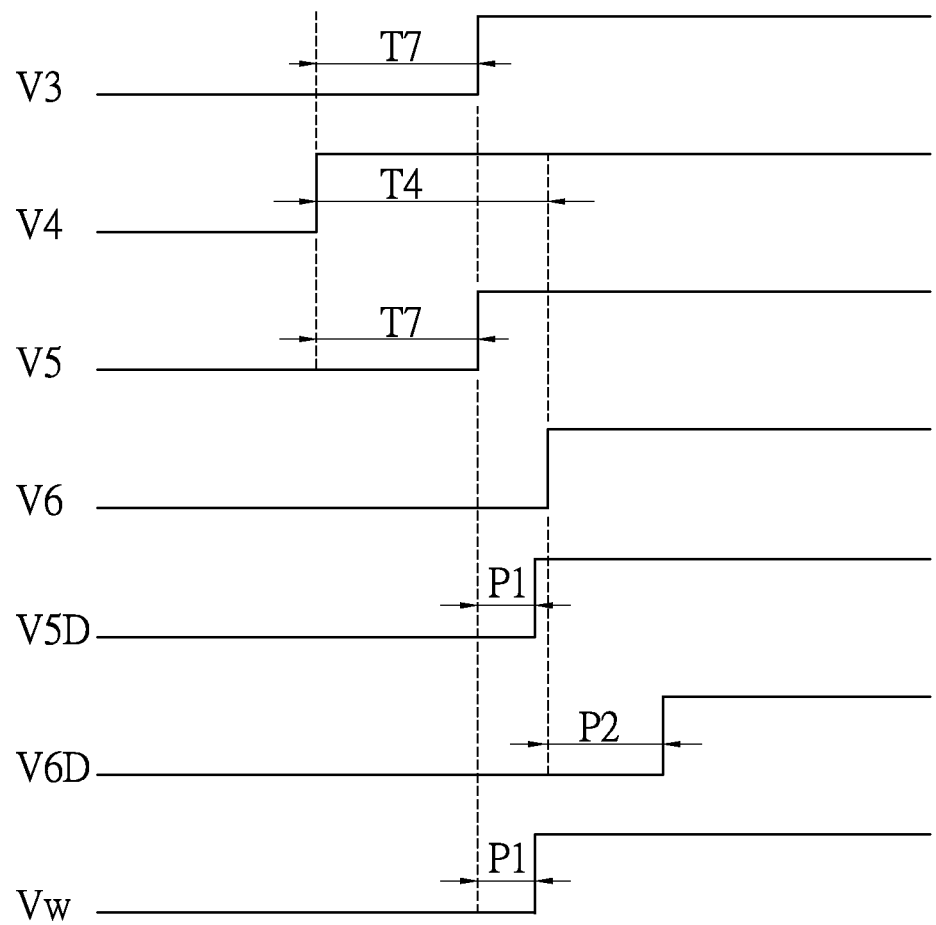

Referring to FIGS. 2, 5 and 11, under the power-saving mode, when the environmental parameter has a greater reduction with respect to the stable environment, for example, the relative humidity changes from 50% to 45%, the capacitance of the capacitor (C1) decreases, and the second phase difference by which the positive edge of the third voltage signal (V3) lags the positive edge of the fourth voltage signal (V4) is T7. If (T4-T7)>P1, i.e., the variation of the second phase difference resulting from the decrement (5%) of the humidity is greater than the predetermined first delay period, the wakeup signal ($V_W$) transitions from logic "0" to logic "1" at the positive edge of the delayed fifth voltage signal (V5D) based on the waveforms of the fifth voltage signal (V5), the sixth voltage signal (V6), the delayed fifth voltage signal (V5D) and the delayed sixth voltage signal (V6D), so that the readout module 2 starts to operate in the normal operation mode.

Accordingly, the predetermined variation range for the environmental parameter may be determined by the predetermined first and second delay periods (P1, P2), such that the readout module 2 operates in the power-saving mode to reduce power consumption when the variation of the environmental parameter falls within the predetermined variation range, and operates in the normal operation mode to correctly reflect the magnitude of the environmental parameter when the variation of the environmental parameter falls out of the predetermined variation range.

Figure 12:
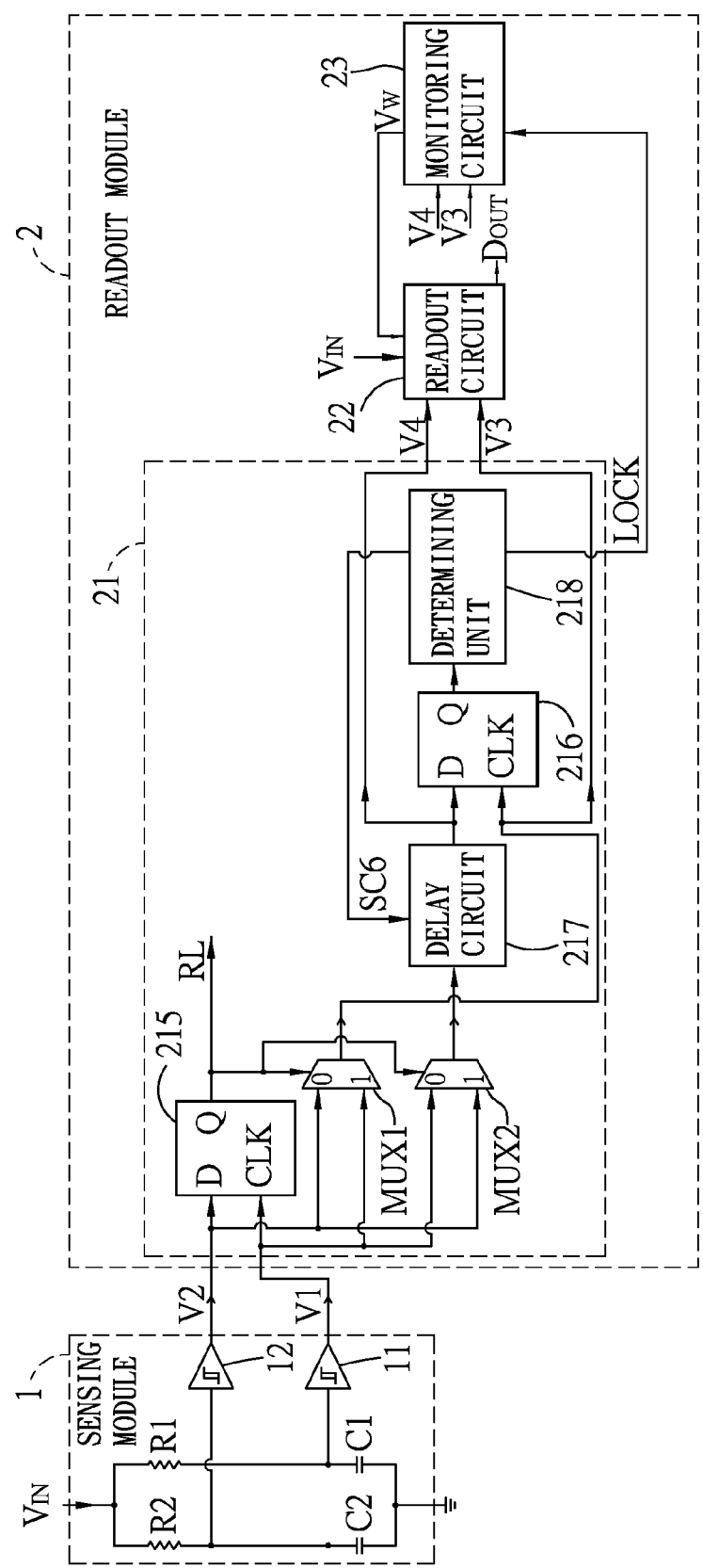
FIG. 12 is a block diagram illustrating a second embodiment of the readout system according to this disclosure.

Referring to FIG. 12, the second embodiment of the readout system according to the disclosure is shown to be similar to the first embodiment, and differs in the sensing module 1 and the first DLL 21 of the readout module 2.

In this embodiment, the sensing module 1 includes a first resistor (R1), a second resistor (R2), a first capacitor (C1), a second capacitor (C2), a first comparator 11 and a second comparator 12. The environmental parameter may be an acceleration component applied to the sensing module 1 along a first direction. The capacitance of one of the first and second capacitors (C1, C2) is positively correlated to the current environmental parameter, and the capacitance of the other one of the first and second capacitors (C1, C2) is negatively correlated to the current environmental parameter.

It is noted that, in this embodiment, the environmental parameter is associated with acceleration, and the output code ($D_{OUT}$) reflects variation of the acceleration. In other embodiments, the environmental parameter may be associated with other environmental variable that may employ the first and second capacitors (C1, C2), which respectively have positive and negative correlations to the environmental parameter.

The first resistor (R1) has a first terminal receiving the input voltage signal ($V_{IN}$), and a second terminal.

The first capacitor (C1) is coupled between the second terminal of the first resistor (R1) and ground, and has a capacitance positively correlated to the current environmental parameter.

The first comparator 11 has an input terminal coupled to the second terminal of the first resistor (R1), and outputs the first voltage signal (V1).

The second resistor (R2) has a first terminal receiving the input voltage signal ($V_{IN}$), and a second terminal.

The second capacitor (C2) is coupled between the second terminal of the second resistor (R2) and ground, and has a capacitance negatively correlated to the environmental parameter.

The second comparator 12 has an input terminal coupled to the second terminal of the second resistor (R2), and outputs the second voltage signal (V2). In this embodiment, the function of each of the first and second comparators 11, 12 is the same as that of the comparator 11 of the first embodiment.

It is noted that the acceleration resulting from gravity is not considered hereinafter for simplifying the following descriptions. In this embodiment, when the acceleration component applied to the sensing module 1 along the first direction is positive, the capacitance of the first capacitor (C1) increases and the capacitance of the second capacitor (C2) decreases. In contrast, when the acceleration component applied to the sensing module 1 along the first direction is negative, the capacitance of the first capacitor (C1) decreases and the capacitance of the second capacitor (C2) increases. The absolute values of the capacitance variations of the first and second capacitors (C1, C2) are equal, and are associated with the absolute value of the variation of the acceleration component. Accordingly, in this embodiment, the positive edge of the second voltage signal (V2) may either lead or lag the positive edge of the first voltage signal (V1).

The first DLL 21 of the readout module 2 generates a phase indication signal (RL) that indicates the lead/lag relationship between phases of the first and second voltage signals (V1, V2), and includes a first phase detector 215, a first multiplexer (MUX1), a second multiplexer (MUX2), a delay circuit 217, a second phase detector 216 and a determining unit 218.

The first phase detector 215 is coupled to the first and second comparators 11, 12 for respectively receiving the first and second voltage signals (V1, V2) therefrom, and detects the phases of the first and second voltage signals (V1, V2) so as to generate the phase indication signal (RL). In this embodiment, the first phase detector is a D flip-flop having a clock terminal (CLK) receiving the first voltage signal (V1) and a data terminal (D) receiving the second voltage signal (V2).

The first multiplexer (MUX1) is coupled to the first phase detector 215, the first comparator 11 and the second comparator 12 for respectively receiving therefrom the phase indication signal (RL), the first voltage signal (V1) and the second voltage signal (V2), and outputs, according to the phase indication signal (RL), a lagged one of the first and second voltage signals (V1, V2) to serve as the third voltage signal (V3).

The second multiplexer (MUX2) is coupled to the first phase detector 215, the first comparator 11 and the second comparator 12 for respectively receiving therefrom the phase indication signal (RL), the first voltage signal (V1) and the second voltage signal (V2), and outputs, according to the phase indication signal (RL), a leading one of the first and second voltage signals (V1, V2) to serve as a phase-lead signal.

In this embodiment, operations of the delay circuit 217, the second phase detector 216 and the determining unit 218 are respectively the same as those of the delay circuit 211, the phase detector 212 and the determining unit 213 of the first embodiment.

The delay circuit 217 is coupled to the second multiplexer (MUX2) for receiving the leading one of the first and second voltage signals (V1, V2), i.e., the phase-lead signal, and delays the same by the calibration period indicated by a control signal (SC6) to serve as the fourth voltage signal (V4). The delay circuit 217 may be implemented in a structure as shown in FIG. 3, but may have a different number of the delay cells 214.

The second phase detector 216 is coupled to the first multiplexer (MUX1) and the delay circuit 217 for respectively receiving the third and fourth voltage signals (V3, V4) therefrom, and detects phases of the third and fourth voltage signals (V3, V4) so as to output the first phase detection signal. In this embodiment, the second phase detector 216 may be a D flip-flop.

The determining unit 218 is coupled to the second phase detector 216 for receiving the first phase detection signal therefrom, and to the delay circuit 217, and generates, according to the first phase detection signal, the control signal (SC6) that is provided to the delay circuit 217, and the calibration indication signal (LOCK). The determining unit 218 may be the same as the determining unit 213 of the first embodiment.

In the second embodiment, for example, when the acceleration component along the first direction is zero, each of the first and second capacitors (C1, C2) has a capacitance of approximately 200 fF. Acceleration of 1 G may lead to a capacitance variation of 1 fF, while a deviation of the capacitance due to process variation may be roughly 5 fF to 10 fF. Therefore, it is important to calibrate the deviation by use of the first DLL 21 to apply a delay of the calibration period. In addition, the output code ($D_{OUT}$) is outputted to reflect the environmental parameter via the capacitance variation, thereby achieving both a wider dynamic range and a higher resolution in comparison to the aforesaid conventional technique that uses an ADC to directly detect the voltage across the variable capacitor.

Figure 13:
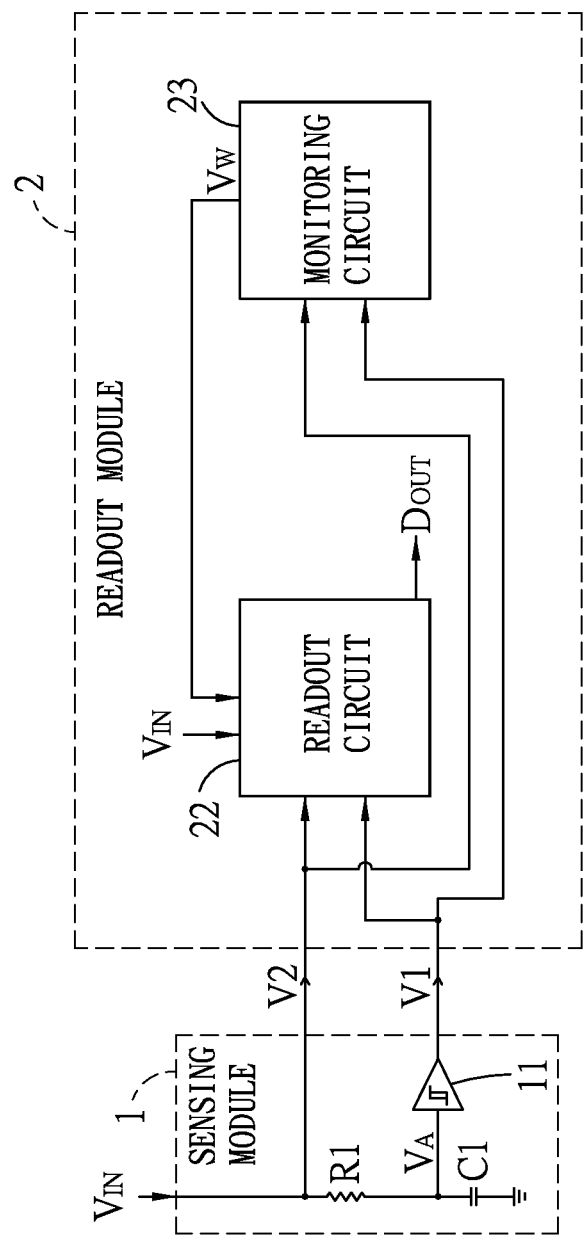
FIG. 13 is a block diagram illustrating a third embodiment of the readout system according to this disclosure.

Referring to FIG. 13, the third embodiment of the readout system according to this disclosure is shown to be similar to the first embodiment, and differs in that the readout module 2 of the third embodiment does not include the first DLL 21 (see FIG. 2), and the third and fourth voltage signals (V3, V4) of the first embodiment are replaced by the first and second voltage signals (V1, V2). In other words, the XOR gate (XOR1, see FIG. 4) of the readout circuit 22 is coupled to the sensing module 1 for receiving the first and second voltage signals (V1, V2) therefrom; the delay circuit 232 (see FIG. 5) of the second DLL 231 and the phase detector 233 of the monitoring circuit 23 are coupled to the sensing module 1 for respectively receiving the second and first voltage signals (V2, V1) therefrom; no calibration indication signal (LOCK, see FIG. 5) is provided to the monitoring circuit 23, and the first and second flip-flops (DFF1, DFF2, see FIG. 5) have the reset terminals thereof floating or have no reset terminals; and the wakeup signal ($V_W$) is generated based on the first and second voltage signals (V1, V2) that correspond to the third and fourth voltage signals (V3, V4, see FIG. 5) of the first embodiment.

Figure 14:
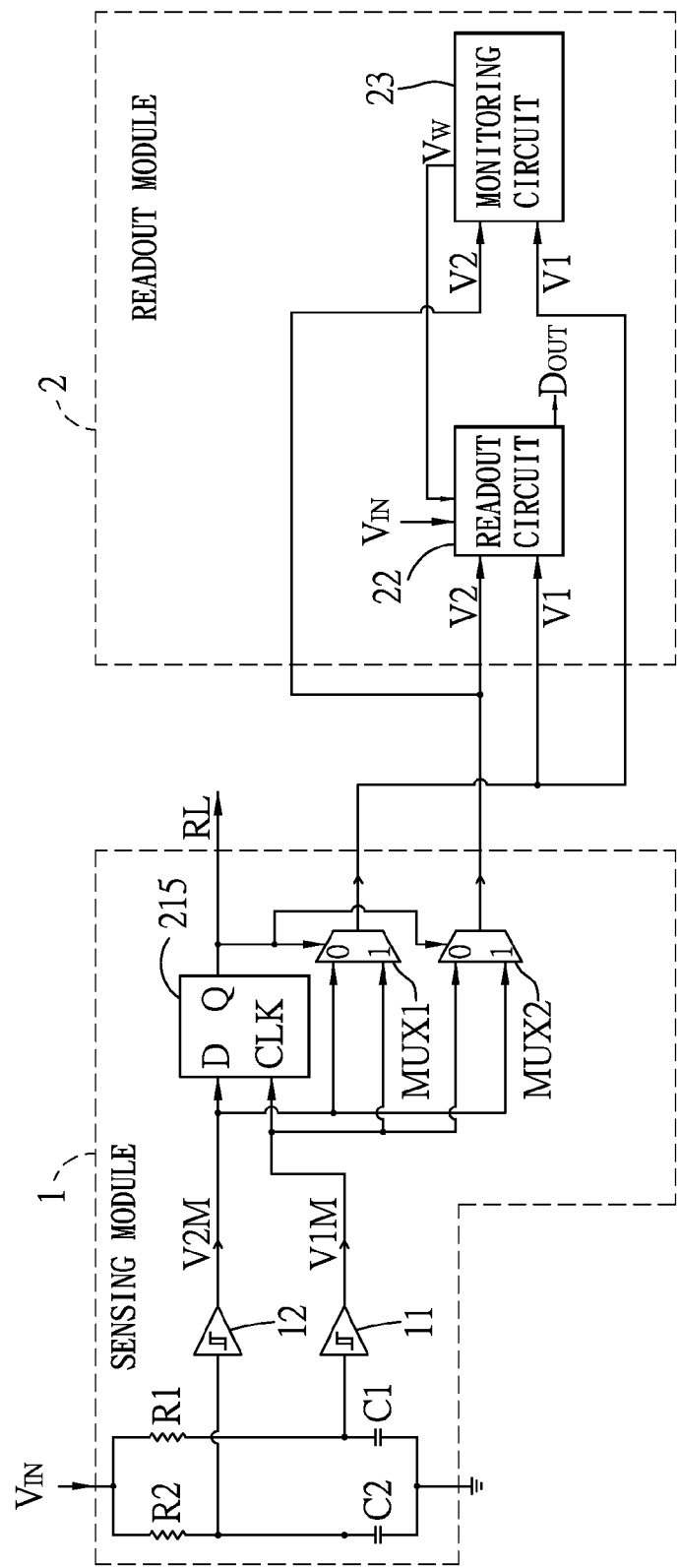
FIG. 14 is a block diagram illustrating a fourth embodiment of the readout system according to this disclosure.

Referring to FIG. 14, the fourth embodiment of the readout system according to this disclosure is shown to be similar to the third embodiment, and differs in that the sensing module 1 of the fourth embodiment includes a first resistor (R1), a second resistor (R2), a first capacitor (C1), a second capacitor (C2), a first comparator 11, a second comparator (12), a phase detector 215, a first multiplexer (MUX1) and a second multiplexer (MUX2). Similar to the third embodiment, no calibration indication signal (LOCK, see FIG. 5) is provided to the monitoring circuit 23, the first and second flip-flops (DFF1, DFF2, see FIG. 5) have the reset terminals thereof floating or have no reset terminals, and the wakeup signal ($V_W$) is generated based on the first and second voltage signals (V1, V2) that correspond to the third and fourth voltage signals (V3, V4, see FIG. 5) of the first embodiment.

In this embodiment, the first resistor (R1) has a first terminal receiving the input voltage signal ($V_{IN}$), and a second terminal.

The first capacitor (C1) is coupled between the second terminal of the first resistor (R1) and ground, and has a capacitance positively correlated to the current environmental parameter.

The first comparator 11 has an input terminal coupled to the second terminal of the first resistor (R1), and outputs a first intermediate signal (V1M).

The second resistor (R2) has a first terminal receiving the input voltage signal ($V_{IN}$), and a second terminal.

The second capacitor (C2) is coupled between the second terminal of the second resistor (R2) and ground, and has a capacitance negatively correlated to the environmental parameter.

The second comparator 12 has an input terminal coupled to the second terminal of the second resistor (R2), and outputs a second intermediate signal (V2M). In this embodiment, the function of each of the first and second comparators 11, 12 is the same as that of the comparator 11 of the first embodiment. The phase detector 215 is coupled to the first and second comparators 11, 12 for respectively receiving the first and second intermediate signals (V1M, V2M) therefrom, and detects the phases of the first and second intermediate signals (V1M, V2M) so as to generate the phase indication signal (RL).

The first multiplexer (MUX1) is coupled to the phase detector 215, the first comparator 11 and the second comparator 12 for respectively receiving therefrom the phase indication signal (RL), the first intermediate signal (V1M) and the second intermediate signal (V2M), and outputs, according to the phase indication signal (RL), a lagged one of the first and second intermediate signals (V1M, V2M) to serve as the first voltage signal (V1).

The second multiplexer (MUX2) is coupled to the phase detector 215, the first comparator 11 and the second comparator 12 for respectively receiving therefrom the phase indication signal (RL), the first intermediate signal (V1M) and the second intermediate signal (V2M), and outputs, according to the phase indication signal (RL), a leading one of the first and second intermediate signals (V1M, V2M) to serve as the second voltage signal (V2).

It is noted that, although the third and fourth embodiments do not include the first DLL 21 as described in the first embodiment and lack the function of calibrating the deviation caused by the process variation, the monitoring circuit 23 enables the readout module 2 to operate in the power-saving mode to reduce power consumption.

In summary, the first DLL 21 of this disclosure may be used for calibration by applying a delay equal to the calibration period, such that even if the sensing modules 1 of respective readout systems may have different first phase differences due to the process variations, the same output code may be obtained with the same environmental parameter. In addition, the monitoring circuit 23 of this disclosure may determine whether or not the variation of the environmental parameter falls within the predetermined variation range, to thereby enable the readout module 2 to operate in the power-saving mode and thus reduce power consumption.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A readout system for generating an output code associated with an environmental parameter, said readout system comprising:
   a sensing module disposed to receive an input voltage signal and configured to sense the environmental parameter, and to generate, according to the input voltage signal and the environmental parameter, a first voltage signal and a second voltage signal that have a phase difference therebetween; and
   a readout module including:
   a first delay-locked loop coupled to said sensing module for receiving the first and second voltage signals therefrom, and configured to output a lagged one of the first and second voltage signals to serve as a third voltage signal, and to delay the other one of the first and second voltage signals by a calibration period associated with a predetermined value of the environmental parameter to output a fourth voltage signal; and a readout circuit disposed to receive the input voltage signal, coupled to said first delay-locked loop for receiving the third and fourth voltage signals therefrom, and configured to convert a phase difference between the third and fourth voltage signals, according to the input voltage signal, into the output code when said readout module operates in a normal operation mode.

2. The readout system according to claim 1, wherein said readout module is further configured to selectively operate in a calibration mode where said readout module makes the calibration period equal the phase difference between the first and second voltage signals so that the third and fourth voltage signals are in-phase.

3. The readout system according to claim 2, wherein:
said first delay-locked loop is further configured to generate a calibration indication signal that indicates whether or not said readout module operates in the calibration mode;
said readout module further includes a monitoring circuit coupled to said first delay-locked loop for receiving the calibration indication signal, the third voltage signal and the fourth voltage signal therefrom, and is configured to:
when the calibration indication signal indicates that said readout module does not operate in the calibration mode, determine whether or not a variation of the environmental parameter falls within a predetermined variation range according to the third and fourth voltage signals,
generate a wakeup signal causing said readout module to operate in a power-saving mode when determining that the variation of the environmental parameter falls within the predetermined variation range, and
generate the wakeup signal causing said readout module to operate in the normal operation mode when otherwise;
said readout circuit is further coupled to said monitoring circuit for receiving the wakeup signal therefrom, and is further configured to refrain from converting the phase difference between the third and fourth voltage signals into the output code when said readout module operates in the power-saving mode.

4. The readout system according to claim 3, wherein said monitoring circuit includes:
a second delay-locked loop coupled to said first delay-locked loop for receiving the third and fourth voltage signals therefrom, and configured to output the third voltage signal to serve as a fifth voltage signal, and to delay the fourth voltage signal by a monitoring period associated with the phase difference between the third and fourth voltage signals to output a sixth voltage signal; and
a detecting unit including:
a first delay circuit coupled to said second delay-locked loop for receiving the fifth voltage signal therefrom, and configured to delay the fifth voltage signal by a predetermined first delay period to output a delayed fifth voltage signal;
a second delay circuit coupled to said second delay-locked loop for receiving the sixth voltage signal therefrom, and configured to delay the sixth voltage signal by a predetermined second delay period to output a delayed sixth voltage signal;

a first flip-flop having a reset terminal coupled to said first delay-locked loop for receiving the calibration indication signal therefrom, a clock terminal coupled to said first delay circuit for receiving the delayed fifth voltage signal therefrom, a data terminal coupled to said second delay-locked loop for receiving the sixth voltage signal therefrom, and an output terminal;
a second flip-flop having a reset terminal coupled to said first delay-locked loop for receiving the calibration indication signal therefrom, a clock terminal coupled to said second delay circuit for receiving the delayed sixth voltage signal therefrom, a data terminal coupled to said second delay-locked loop for receiving the fifth voltage signal therefrom, and an output terminal; and
a NAND gate having a first input terminal and a second input terminal respectively coupled to said output terminals of said first and second flip-flops, and an output terminal disposed to output the wakeup signal; and
wherein the predetermined variation range for the variation of the environmental parameter is associated with the predetermined first and second delay periods.

5. The readout system according to claim 4, wherein said second delay-locked loop includes:
a delay circuit disposed to receive a control signal that indicates the monitoring period, coupled to said first delay-locked loop for receiving the fourth voltage signal therefrom, and configured to generate the sixth voltage signal according to the fourth voltage signal and the control signal;
a phase detector coupled to said first delay-locked loop for receiving the third voltage signal therefrom to serve as the fifth voltage signal, coupled to said delay circuit for receiving the sixth voltage signal therefrom, and configured to generate a phase detection signal according to phases of the fifth and sixth voltage signals; and
a determining unit coupled to said phase detector for receiving the phase detection signal therefrom, and configured to adjust the monitoring period according to the phase detection signal until the phase detection signal indicates that the fifth and sixth voltage signals are in-phase, and to generate the control signal that is provided to said delay circuit and that indicates the monitoring period thus adjusted.

6. The readout system according to claim 1, wherein said sensing module includes:
a resistor having a first terminal disposed to receive the input voltage signal that serves as the second voltage signal, and a second terminal;
a capacitor coupled between said second terminal of said resistor and a reference node, and having a capacitance associated with the environmental parameter; and
a comparator having an input terminal coupled to said second terminal of said resistor, and being configured to output the first voltage signal.

7. The readout system according to claim 1, wherein said first delay-locked loop is configured to selectively operate in a calibration mode, and includes:
a delay circuit disposed to receive a control signal that indicates the calibration period, coupled to said sensing module for receiving the second voltage signal therefrom, and configured to generate the fourth voltage signal according to the second voltage signal and the control signal;

a phase detector coupled to said sensing module for receiving the first voltage signal therefrom to serve as the third voltage signal, coupled to said delay circuit for receiving the fourth voltage signal therefrom, and configured to generate a phase detection signal according to phases of the third and fourth voltage signals; and a determining unit coupled to said phase detector for receiving the phase detection signal therefrom, and configured to adjust the calibration period according to the phase detection signal until the phase detection signal indicates that the third and fourth voltage signals are in-phase when said readout module operates in the calibration mode, and to generate the control signal that is provided to said delay circuit and that indicates the calibration period thus adjusted in the calibration mode.

8. The readout system according to claim 7, the environmental parameter being one of a temperature and a humidity of an environment in which said sensing module is located, wherein said sensing module includes:
   a resistor having a first terminal disposed to receive the input voltage signal that serves as the second voltage signal, and a second terminal;
   a capacitor coupled to said second terminal of said resistor, and having a capacitance associated with the environmental parameter; and
   a comparator having an input terminal coupled to said second terminal of said resistor, and being configured to output the first voltage signal.

9. The readout system according to claim 1, wherein said sensing module includes:
   a first resistor having a first terminal disposed to receive the input voltage signal, and a second terminal;
   a first capacitor coupled to said second terminal of said first resistor, and having a capacitance associated with the environmental parameter;
   a first comparator has an input terminal coupled to said second terminal of said first resistor, and configured to output the first voltage signal;
   a second resistor having a first terminal disposed to receive the input voltage signal, and a second terminal;
   a second capacitor coupled to said second terminal of said second resistor, and having a capacitance associated with the environmental parameter; and
   a second comparator having an input terminal coupled to said second terminal of said second resistor, and being configured to output the second voltage signal.

10. The readout system according to claim 9, wherein said readout module is further configured to generate a phase indication signal that indicates a relationship between phases of the first and second voltage signals.

11. The readout system according to claim 1, wherein said first delay-locked loop is configured to selectively operate in a calibration mode, and includes:
   a first phase detector coupled to said sensing module for receiving the first and second voltage signals therefrom, and configured to generate a phase indication signal that indicates a relationship between phases of the first and second voltage signals;
   a first multiplexer coupled to said sensing module for receiving the first and second voltage signals therefrom, coupled to said first phase detector for receiving the phase indication signal therefrom, and configured to output the lagged one of the first and second voltage signals to serve as the third voltage signal according to the phase indication signal;
   a second multiplexer coupled to said sensing module for receiving the first and second voltage signals therefrom, coupled to said first phase detector for receiving the phase indication signal therefrom, and configured to output the other one of the first and second voltage signals to serve as a phase-lead signal according to the phase indication signal;
   a delay circuit disposed to receive a control signal that indicates the calibration period, coupled to said second multiplexer for receiving the phase-lead signal therefrom, and configured to generate the fourth voltage signal according to the phase-lead signal and the control signal;
   a second phase detector coupled to said first multiplexer and said delay circuit for respectively receiving the third and fourth voltage signals therefrom, and configured to generate a phase detection signal according to phases of the third and fourth voltage signals; and
   a determining unit coupled to said phase detector for receiving the phase detection signal therefrom, and configured to determine the calibration period according to the phase detection signal when said readout module operates in the calibration mode, and to generate the control signal that is provided to said delay circuit and that indicates the calibration period determined in the calibration mode.

12. The readout system according to claim 11, the environmental parameter being an acceleration component applied to said sensing module, wherein said sensing module includes:
   a first resistor having a first terminal disposed to receive the input voltage signal, and a second terminal;
   a first capacitor coupled to said second terminal of said first resistor, and having a capacitance associated with the environmental parameter;
   a first comparator coupled to said second terminal of said first resistor, and configured to output the first voltage signal;
   a second resistor having a first terminal disposed to receive the input voltage signal, and a second terminal;
   a second capacitor coupled to said second terminal of said second resistor, and having a capacitance associated with the environmental parameter; and
   a second comparator coupled to said second terminal of said second resistor, and configured to output the second voltage signal; and
   wherein the capacitance of one of said first and second capacitors being positively correlated to the environmental parameter, and the capacitance of the other one of said first and second capacitors being negatively correlated to the environmental parameter.

13. The readout system according to claim 1, wherein said readout circuit includes:
   an XOR gate having a first input terminal and a second input terminal both coupled to said first delay-locked loop for respectively receiving the third and fourth voltage signals therefrom, and an output terminal;
   an AND gate having a first input terminal disposed to receive the input voltage signal, a second input terminal coupled to said output terminal of said XOR gate, and an output terminal;
   a digital controlled oscillator coupled to said output terminal of said AND gate, and configured to generate or not generate an oscillating signal according to a signal at said output terminal of said AND gate; and
   a counter disposed to receive the input voltage signal, coupled to said digital controlled oscillator for receiving the oscillating signal therefrom, and configured to generate the output code according to the input voltage signal and the oscillating signal.

14. A readout system for generating an output code associated with an environmental parameter, said readout system comprising:
a sensing module disposed to receive an input voltage signal and configured to sense the environmental parameter, and to generate, according to the input voltage signal and the environmental parameter, a first voltage signal and a second voltage signal that have a phase difference therebetween; and
a readout module including:
a readout circuit disposed to receive the input voltage signal and a wakeup signal, coupled to said sensing module for receiving the first and second voltage signals therefrom, and configured to convert or not covert the phase difference between the first and second voltage signals into the output code according to the wakeup signal; and
a monitoring circuit coupled to said sensing module for receiving the first and second voltage signals therefrom, and is configured to generate the wakeup signal according to the first and second voltage signals.

15. The readout system according to claim 14, wherein said monitoring circuit is configured to:
determine whether or not a variation of the environmental parameter falls within a predetermined variation range according to the first and second voltage signals,
generate the wakeup signal causing said readout module to operate in a power-saving mode when determining that the variation of the environmental parameter falls within the predetermined variation range, and
generate the wakeup signal causing said readout module to operate in a normal operation mode when otherwise.

16. The readout system according to claim 15, wherein the first voltage signal lags the second voltage signal, and said monitoring circuit includes:
a delay-locked loop coupled to said sensing module for receiving the first and second voltage signals therefrom, and configured to output the first voltage signal to serve as a third voltage signal, and to delay the second voltage signal by a monitoring period associated with the phase difference between the first and second voltage signals to output a fourth voltage signal; and
a detecting unit including:
a first delay circuit coupled to said delay-locked loop for receiving the third voltage signal therefrom, and configured to delay the third voltage signal by a predetermined first delay period to output a delayed third voltage signal;
a second delay circuit coupled to said delay-locked loop for receiving the fourth voltage signal therefrom, and configured to delay the fourth voltage signal by a predetermined second delay period to output a delayed fourth voltage signal;
a first flip-flop having a clock terminal coupled to said first delay circuit for receiving the delayed third voltage signal, a data terminal coupled to said delay-locked loop for receiving the fourth voltage signal therefrom, and an output terminal;
a second flip-flop having a clock terminal coupled to said second delay circuit for receiving the delayed fourth voltage signal, a data terminal coupled to said delay-locked loop for receiving the third voltage signal therefrom, and an output terminal; and
a NAND gate having a first input terminal and a second input terminal respectively coupled to said output terminals of said first and second flip-flops, and an output terminal disposed to output the wakeup signal; and
wherein the predetermined variation range for the variation of the environmental parameter is associated with the predetermined first and second delay periods.

17. The readout system according to claim 16, wherein said delay-locked loop includes:
a delay circuit disposed to receive a control signal that indicates the monitoring period, coupled to said sensing module for receiving the second voltage signal therefrom, and configured to generate the fourth voltage signal according to the second voltage signal and the control signal;
a phase detector coupled to said sensing module for receiving the first voltage signal therefrom to serve as the third voltage signal, coupled to said delay circuit for receiving the fourth voltage signal therefrom, and configured to generate a phase detection signal according to phases of the third and fourth voltage signals; and
a determining unit coupled to said phase detector for receiving the phase detection signal therefrom, and configured to adjust the monitoring period according to the phase detection signal until the phase detection signal indicates that the third and fourth voltage signals are in-phase, and to generate the control signal that is provided to said delay circuit and that indicates the monitoring period thus adjusted.

18. The readout system according to claim 14, wherein said sensing module includes:
a resistor having a first terminal disposed to receive the input voltage signal that serves as the second voltage signal, and a second terminal;
a capacitor coupled between said second terminal of said resistor and a reference node, and having a capacitance associated with the environmental parameter; and
a comparator having an input terminal coupled to said second terminal of said resistor, and configured to output the first voltage signal.

19. The readout system according to claim 18, the environmental parameter being one of a temperature and a humidity of an environment in which said sensing module is located.

20. The readout system according to claim 14, wherein said sensing module includes:
a first resistor having a first terminal disposed to receive the input voltage signal, and a second terminal;
a first capacitor coupled to said second terminal of said first resistor, and having a capacitance associated with the environmental parameter;
a first comparator coupled to said second terminal of said first resistor, and configured to output a first intermediate signal;
a second resistor having a first terminal disposed to receive the input voltage signal, and a second terminal;
a second capacitor coupled to said second terminal of said second resistor, and having a capacitance associated with the environmental parameter;
a second comparator coupled to said second terminal of said second resistor, and configured to output a second intermediate signal;
a phase detector coupled to said first and second comparators for respectively receiving the first and second intermediate signals therefrom, and configured to generate a phase indication signal that indicates a relationship between phases of the first and second intermediate signals;

a first multiplexer coupled to said first and second comparators for respectively receiving the first and second voltage signals therefrom, coupled to said phase detector for receiving the phase indication signal therefrom, and configured to output the lagged one of the first and second intermediate signals to serve as the first voltage signal according to the phase indication signal;

a second multiplexer coupled to said first and second comparators for respectively receiving the first and second intermediate signals therefrom, coupled to said phase detector for receiving the phase indication signal therefrom, and configured to output the other one of the first and second intermediate signals to serve as the second voltage signal according to the phase indication signal.

21. The readout system according to claim 20, the environmental parameter being an acceleration component applied to said sensing module, wherein the capacitance of one of said first and second capacitors being positively correlated to the environmental parameter, and the capacitance of the other one of said first and second capacitors being negatively correlated to the environmental parameter.

22. The readout system according to claim 14, wherein said readout circuit includes:

an XOR gate having a first input terminal and a second input terminal both coupled to said sensing module for respectively receiving the first and second voltage signals therefrom, and an output terminal;

an AND gate having a first input terminal disposed to receive the input voltage signal, a second input terminal coupled to said output terminal of said XOR gate, and an output terminal;

a digital controlled oscillator coupled to said monitoring circuit for receiving the wakeup signal therefrom, coupled to said output terminal of said AND gate, and configured to generate or not generate an oscillating signal according to the wakeup signal and a signal at said output terminal of said AND gate; and a counter disposed to receive the input voltage signal, coupled to said digital controlled oscillator for receiving the oscillating signal, and configured to generate the output code according to the input voltage signal and the oscillating signal.

* * * * *